(12) United States Patent
Nayir et al.

(10) Patent No.: US 12,318,841 B2
(45) Date of Patent: Jun. 3, 2025

(54) COLD SINTERING PROCESS FOR DENSIFICATION AND SINTERING OF POWDERED METALS

(71) Applicant: THE PENN STATE RESEARCH FOUNDATION, University Park, PA (US)

(72) Inventors: Selda Nayir, Karapinar Konya (TR); Ramakrishnan Rajagopalan, State College, PA (US); Daudi Waryoba, Dubois, PA (US); Clive Randall, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 17/657,053

(22) Filed: Mar. 29, 2022

(65) Prior Publication Data
US 2022/0226895 A1 Jul. 21, 2022

Related U.S. Application Data

(63) Continuation-in-part of application No. PCT/US2020/051053, filed on Sep. 16, 2020.
(Continued)

(51) Int. Cl.
*B22F 3/02* (2006.01)
*B22F 1/10* (2022.01)
(Continued)

(52) U.S. Cl.
CPC ............ *B22F 3/02* (2013.01); *B22F 1/10* (2022.01); *B22F 1/148* (2022.01); *B22F 3/1035* (2013.01);
(Continued)

(58) Field of Classification Search
CPC ............ C04B 35/645; C04B 2235/6588; B22F 3/1039; B22F 3/1003
See application file for complete search history.

(56) References Cited

U.S. PATENT DOCUMENTS

| 3,846,126 A | 11/1974 | Foley |
| 4,393,563 A | 7/1983 | Smith |

(Continued)

FOREIGN PATENT DOCUMENTS

| WO | 9934970 | 7/1999 | |
| WO | WO-2017058727 A1 * | 4/2017 | ............ B32B 15/08 |
| WO | 2019040864 | 2/2019 | |

OTHER PUBLICATIONS

Shen et al. ("Sintering, microstructure and magnetic properties of low-temperature-fired NiCuZn ferrites doped with B2O3." Ceramics International 40.7 (2014): 9205-9209.) (Year: 2014).*

(Continued)

*Primary Examiner* — Ricardo D Morales
(74) *Attorney, Agent, or Firm* — Buchanan Ingersoll & Rooney PC

(57) ABSTRACT

Embodiments can relate to an improved hydroflux, additive or electroless plating assisted densification cold sintering process to densify powdered metals at lower compaction pressures and lower temperatures (e.g., 520 MPa and 140° C.). The process can involve inducing dissolution precipitation mechanisms at powder interfaces by introducing a transport phase (formed by the introduction of water during the process to suppress melting temperatures) that is not an aqueous solution. Particle interfaces in the cold sinter fuse together by the presence of the additional transport phase, thereby reducing the temperatures and pressures needed for compaction. Some embodiments involve the use of elements to form a eutectic at the desired low temperature, thereby stabilizing certain crystal structure shapes of isometric crys- (Continued)

tal systems, inducing rapid densification, and facilitating pore smoothing. Embodiments of the process can be used to generate a green compact via sintering that exhibits improved green strength.

15 Claims, 36 Drawing Sheets

Related U.S. Application Data

(60) Provisional application No. 62/907,950, filed on Sep. 30, 2019.

(51) Int. Cl.
*B22F 1/148* (2022.01)
*B22F 3/10* (2006.01)
*B22F 3/24* (2006.01)
*B22F 3/26* (2006.01)
*C30B 7/10* (2006.01)

(52) U.S. Cl.
CPC ............... *B22F 3/26* (2013.01); *C30B 7/10* (2013.01); *B22F 2003/247* (2013.01)

(56) References Cited

U.S. PATENT DOCUMENTS

| | | | |
|---|---|---|---|
| 4,599,277 A | 7/1986 | Brownlow et al. | |
| 5,098,469 A | 3/1992 | Rezhets | |
| 6,887,296 B2 | 5/2005 | Mende et al. | |
| 8,187,394 B2* | 5/2012 | Ye | H01F 41/0246 |
| | | | 148/306 |
| 8,313,802 B2 | 11/2012 | Riman et al. | |
| 2004/0159390 A1 | 8/2004 | Lautzenhiser et al. | |
| 2008/0171647 A1 | 7/2008 | Lee et al. | |
| 2009/0142578 A1* | 6/2009 | Riman | C04B 35/64 |
| | | | 428/319.1 |
| 2016/0089811 A1* | 3/2016 | Matsuyuki | B28D 1/14 |
| | | | 264/645 |
| 2017/0088471 A1 | 3/2017 | Randall et al. | |

OTHER PUBLICATIONS

Kahari, H. et al., Improvements and Modifications to Room-Temperature Fabrication Method for Dielectric Li2MoO4 Ceramics, J. Am. Ceram. Soc., 2015, pp. 687-689, The American Ceramic Society.
International Search Report and Written Opinion for PCT/US2020/051053 filed Sep. 16, 2020 dated Nov. 26, 2020.

* cited by examiner

Microstructure of the densified iron compound that had phosphorous added to the mixture Microstructure of the densified iron compound that did not have phosphorous added to the mixture Microstructure of the densified nickel compound that had phosphorous added to the mixture Microstructure of the densified nickel compound that did not have phosphorous added to the mixture Image of the densified nickel compound that had phosphorous added to the mixture Image of the densified nickel compound that did not have phosphorous added to the mixture Image of the densified brass compound that had phosphorous added to the mixture Image of the densified brass compound that did not have phosphorous added to the mixture Warm compacted (control)

Cold sintered iron

Control Sintered via an embodiment of the process

Dark regions show the presence of lubricant

Warm compacted control

Cold sintered iron

Warm compacted control    Cold sintered sample

COLD SINTERING PROCESS FOR DENSIFICATION AND SINTERING OF POWDERED METALS

CROSS-REFERENCE TO RELATED APPLICATIONS

This application is a continuation-in-part of and claims priority to International Application PCT/US2020/051053, filed on Sep. 16, 2020, which is related to and claims the benefit of U.S. Provisional Application No. 62/907,950, filed on Sep. 30, 2019, the entire contents of each is incorporated herein by reference.

FIELD OF THE INVENTION

Embodiments can relate to an improved hydroflux assisted densification cold sintering process to densify powdered metals at lower compaction pressures and lower temperatures (e.g., 520 MPa and 140° C., respectively). The process can involve inducing dissolution precipitation mechanisms at powder interfaces or electroless plating process that binds particles or hydrothermal reaction at the interface by introducing a transport phase (formed by the introduction of water during the process to suppress melting temperatures) that is not an aqueous solution.

BACKGROUND OF THE INVENTION

With conventional sintering systems and methods, it can be difficult to manufacture parts with green density close to 100% theoretical density. Traditional compaction methods typically only lead to relative density of about 88%-92%. In addition, conventional compaction methods generally result in compacts with low density and strength components that cannot withstand high loads and are also susceptible to corrosion due to residual porosity in the component.

Sintered powder metal components generally show lower machining behavior as compared to wrought materials. This behavior is mainly due to interrupted cutting, lower thermal conductivity and presence of hard particles/phases. This results in significant tool wear due to erosion, diffusion and deformation phenomena. Hence, it is extremely advantageous to machine the components in the green state i.e. before high temperature sintering. However, green strength of most powder metallurgy (PM) parts is insufficient to allow proper holding of the parts in the chuck of a lathe or other machines and tends lead to catastrophic failure. Warm compaction along with the use of special polymeric lubricants have shown to improve the green strength by a factor of five thereby allowing the possibility to perform machining operations such as drilling.

Examples of known systems and methods related to densification and sintering of powdered materials can be appreciated from U.S. Pat. Nos. 8,313,802, 4,393,563, 4,599,277, 5,098,469, U.S. Pat. Publ. No. 2017/0088471, U.S. Pat. Publ. No. 2008/0171647, U.S. Pat. Publ. No. 2004/0159390, International Application No. WO 2019/040864, International Application No. WO 1999/0034970, and Kahari, Hanna et al., Improvements and modifications to room-temperature fabrication method for dielectric Li2MoO4 ceramics', Journal of the American Ceramic Society 22 Jan. 2015, Vol. 98, No. 3, pp. 687-689.

SUMMARY OF THE INVENTION

Embodiments can relate to an improved hydroflux assisted densification cold sintering process to densify powdered metals at lower compaction pressures and lower temperatures (e.g., 520 MPa and 140° C., respectively). The process can involve inducing dissolution precipitation mechanisms or electroless plating or hydrothermal reaction at powder interfaces by introducing a transport phase (formed by the introduction of water during the process to suppress melting temperatures) that is an aqueous solution. Particle interfaces in the cold sinter fuse together by the presence of the additional transport phase, thereby reducing the temperatures and pressures needed for compaction. Some embodiments involve the use of elements (e.g., phosphorous, boron, manganese, copper, sulfur, etc.) as sintering aids to form a eutectic at the desired low temperature, thereby stabilizing certain crystal structure shapes of isometric crystal systems, inducing rapid densification, and facilitating pore smoothing. Embodiments of the process can be used to generate a green compact via sintering that exhibits improved green strength.

In an exemplary embodiment, a method of forming a mixture to be densified comprises combining a solvent with a metal compound to form a mixture and before, during, or after the mixture is formed, adding water to the solvent so as to suppress fluxes that are generated when heat and pressure are applied to the mixture.

In some embodiments, water is added to the solvent to form an aqueous solution that is within a range from 1-2% by weight of water.

In some embodiments, the method further comprises adding a sintering aid to form a eutectic at a predetermined low temperature for stabilizing crystal structure shapes.

In some embodiments, the sintering aid comprises phosphorous, boron, and/or manganese.

In some embodiments, the metal compound includes any one or combination of iron, nickel, steel, stainless steel, copper, brass, bronze, copper-silver alloy, tantalum, titanium, and silver.

In some embodiments, the solvent includes any one or combination of $CuSO_4$/Sodium citrate aqueous solution and acetic acid with water.

In an exemplary embodiment, a mixture formulation for a sintered material comprises a metal compound; and a solvent, wherein the solvent includes water to suppress fluxes that are generated when heat and pressure are applied to the mixture.

In some embodiments, the solvent is an aqueous solution comprising water within a range from 1-2% by weight of water.

In some embodiments, the solvent includes any one or combination of $CuSO_4$/Sodium citrate aqueous solution and acetic acid with water.

In some embodiments, the solvent is configured to have a boiling point within a range from 100° C. to 200° C.

In some embodiments, the mixture formulation further comprises a sintering aid configured to form a eutectic at a predetermined low temperature for stabilizing crystal structure shapes.

In some embodiments, the sintering aid comprises phosphorous, boron, and/or manganese.

In an exemplary embodiment, a method of forming a densified material comprises combining a solvent with a metal compound to form a mixture; adding water to the solvent before, during, or after combining the solvent with the metal compound to form an aqueous solution; allowing fluxes to form in the mixture; applying pressure to evaporate the solvent via a transient aqueous environment, leading to densification of the metal compound by a mediated dissolution-precipitation process; applying temperature to cause the solvent to further evaporate, supersaturate any solubilized species, and densify the metal compound; and generating a densified material that is >90% the theoretical density for the metal compound.

In some embodiments, generating the densified material consists essentially of combining a solvent with an inorganic compound to form the mixture; adding water to the solvent before, during, or after combining the solvent with the inorganic compound; allowing fluxes to form in the mixture; applying pressure to evaporate the solvent via the transient aqueous environment, leading to densification of the metal compound by the mediated dissolution-precipitation process; and applying temperature to cause the solvent to further evaporate, supersaturate any solubilized species, and densify the metal compound.

In some embodiments, the method further comprises allowing the solvent to partially solubilize the metal compound to form the mixture.

In some embodiments, the method further comprises allowing the added water to suppress the melting temperature of the fluxes during the application of pressure and temperature, causing solid surfaces of the metal compound to decompose and partially dissolve in the solvent.

In some embodiments, the method further comprises allowing a high-temperature melt of metal material formed during the application of pressure and temperature to dissolve precursor material and promote nucleation, leading to growth of a crystal from the aqueous solution.

In some embodiments, the method further comprises generating a hydro-flux that spans a regime between flux growth and hydrothermal growth so that an intersection of hydrothermal and flux-based crystal growth in the phase diagram introduces a mass transport phase at temperatures at or near a boiling point of the solvent, the mass transport phase being a non-aqueous solution.

In some embodiments, applying pressure comprises applying 520 MPa and applying temperature comprises applying temperature within a range from 25° C. to 300° C.

In some embodiments, the method further comprises adding a sintering aid to form a eutectic at a predetermined low temperature for stabilizing crystal structure shapes.

In some embodiments, the generated densified material is machinable.

In some embodiments, the method further comprises forming the densified material into a cold sintered pellet, and one or more of the following: drilling a hole through the cold sintered metal pellet; taping or threading the cold sintered metal pellet; and performing a turning operation on the cold sintered pellet on a lathe.

In some embodiments, the method further comprises depositing a metal or a compound at metal interfaces of the metal compound to promote bonding between particles; sinter bonding at low temperatures with metal components to add functionality; cold sintering the metal compound to improve strength, hardness, and/or toughness; cold sintering the metal compound with the addition of polymeric materials; infiltrating with low temperature eutectic alloys; and/or vacuum impregnating with sealant.

In some embodiments, the generated densified material demonstrates significant improvement in Transverse rupture strength relative to a conventional powder metallurgy (PM) or a warm compaction process.

In some embodiments, the generated densified material demonstrates an optimum amount of sintering additive to promote improvement in Transverse rupture strength under Cold sintered and post high temperature heat treatment conditions.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present innovation will be more apparent from the following more particular description thereof, presented in conjunction with the following drawings. Like reference numbers used in the drawings may identify like components.

DETAILED DESCRIPTION OF THE INVENTION

The following description is of exemplary embodiments that are presently contemplated for carrying out the present invention. This description is not to be taken in a limiting sense, but is made merely for the purpose of describing the general principles and features of various aspects of the present invention. The scope of the present invention is not limited by this description.

Figure 1:
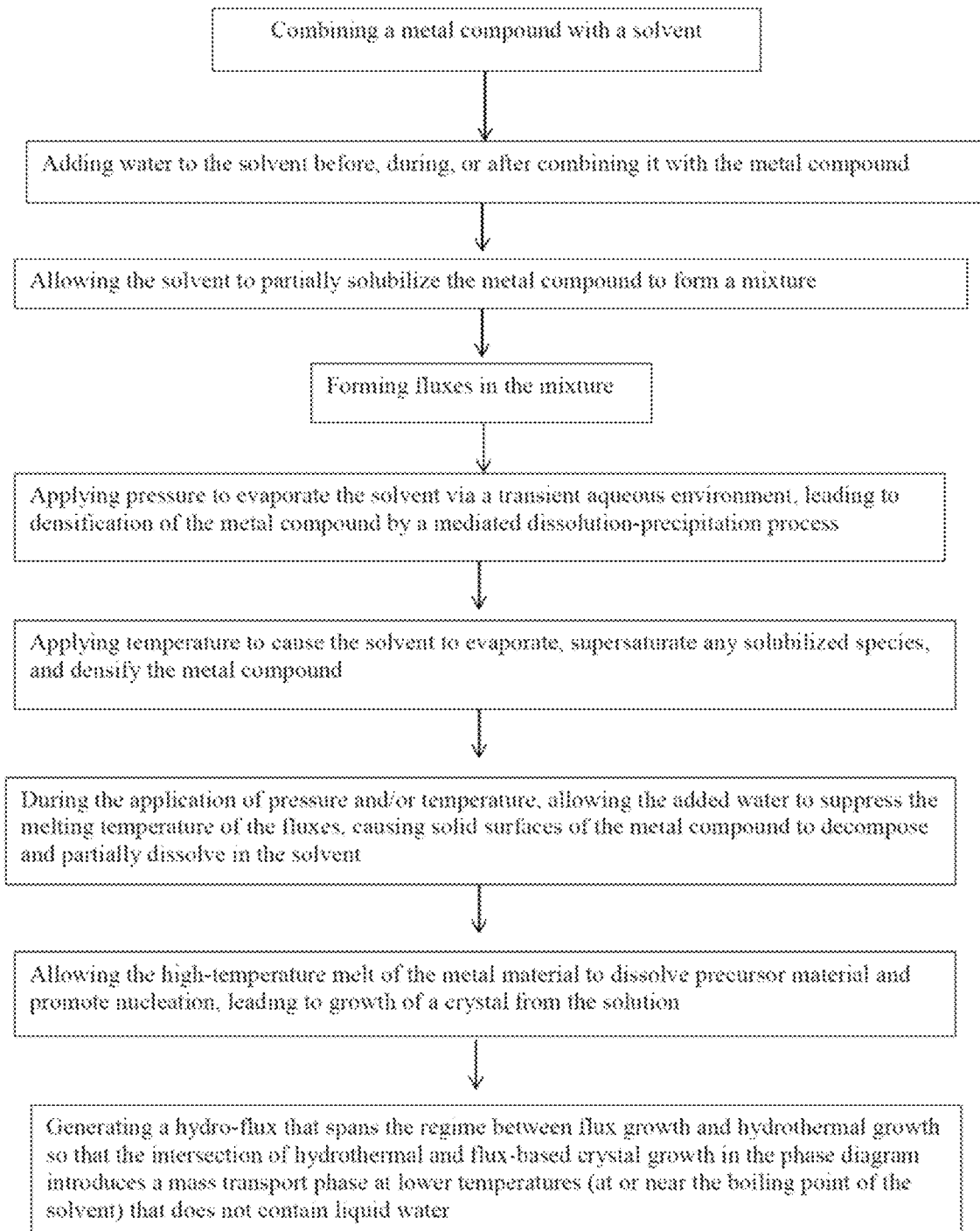
FIG. 1 is an exemplary flow diagram of an embodiment of the sintering process.
Figure 2:
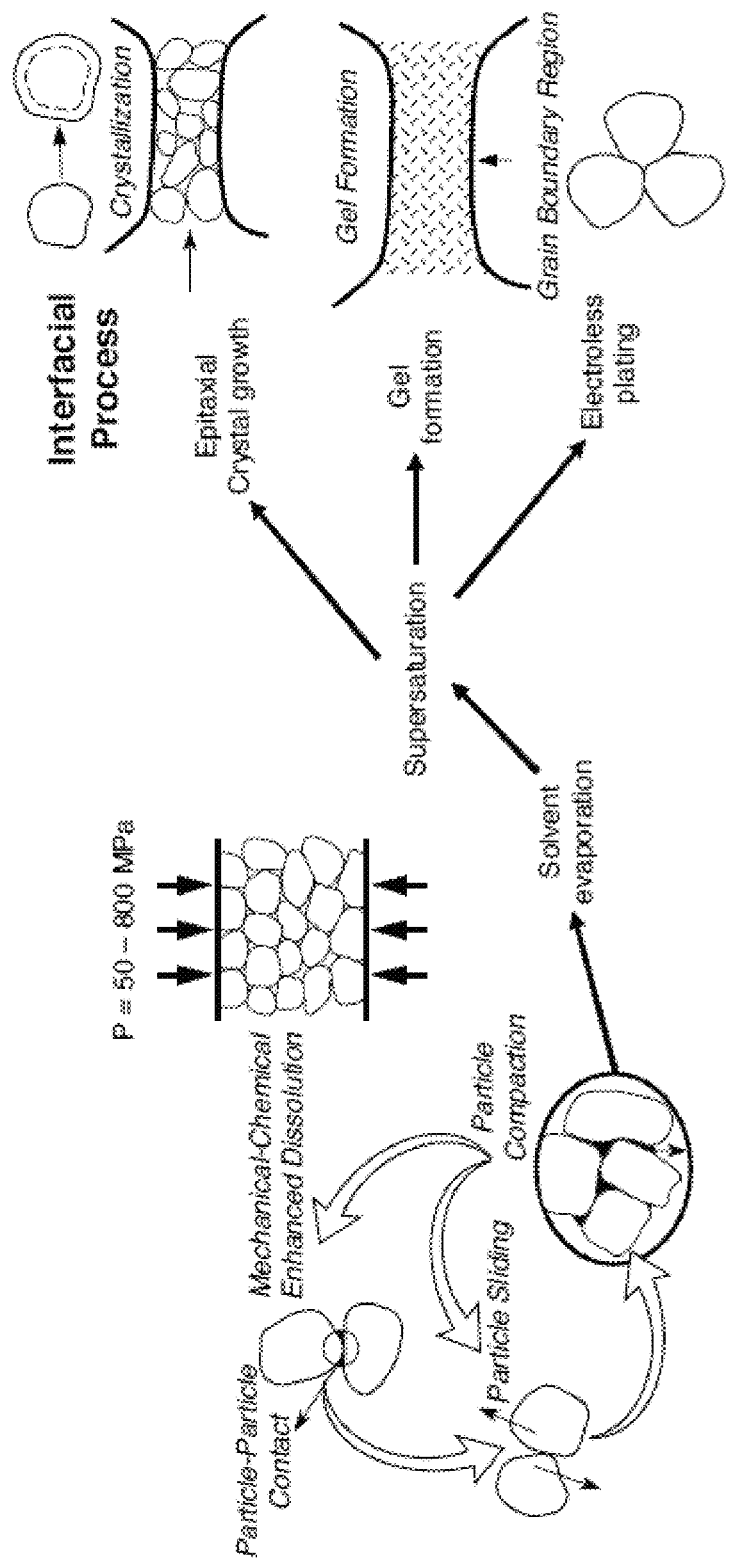
FIG. 2 is an exemplary flow diagram demonstrating dissolution precipitation mechanisms at powder interfaces that can be induced via an embodiment of the process.
Figure 3:
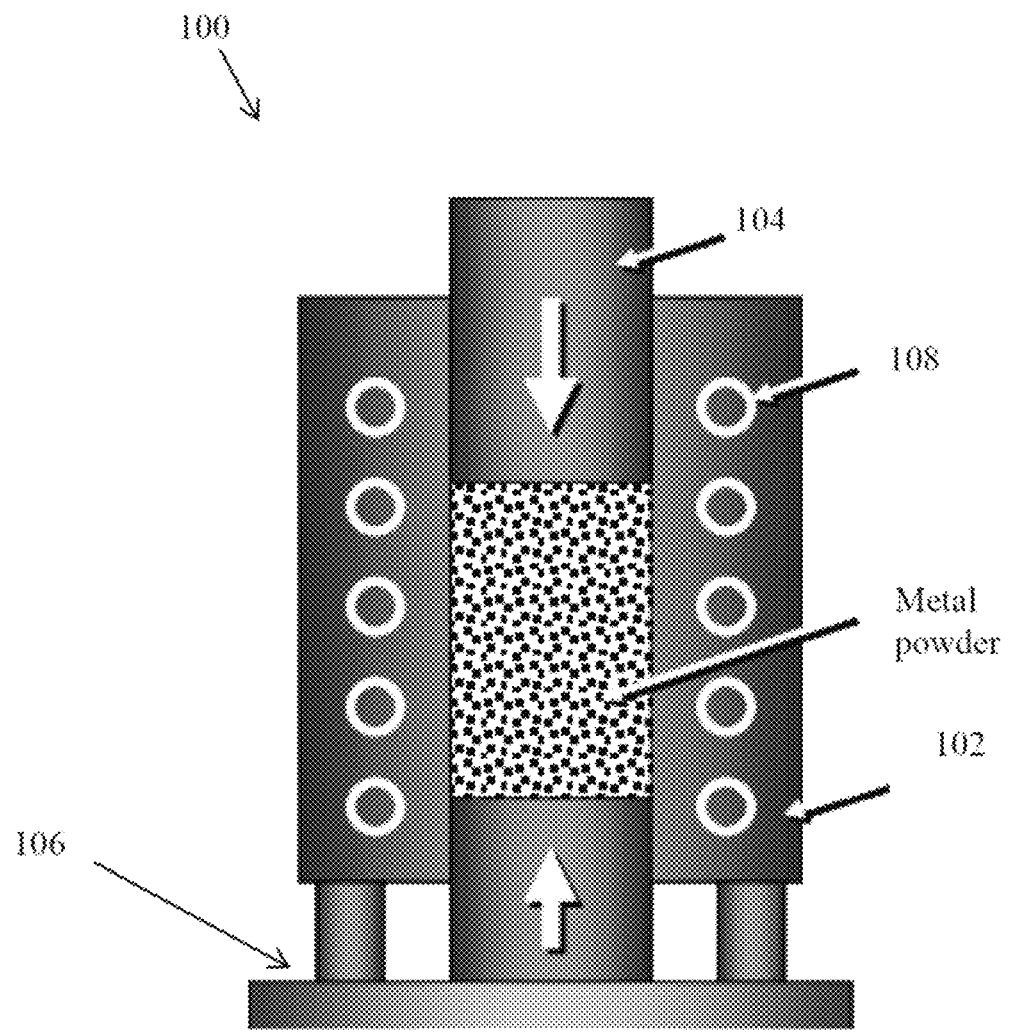
FIG. 3 is an exemplary press and die set-up that may be used to carry out an embodiment of the process.

Referring to FIGS. 1-3, embodiments relate to an improved hydroflux assisted densification process. A hydroflux assisted densification process can be a process that introduces a mass transport phase for sintering metal compounds into a densified material. The mass transport phases can be formed by the introduction of water during the sintering process to suppress melting temperatures of fluxes so that the fluxes can utilize the high temperature of the melt as a solvent for crystallization. Embodiments of the process can densify powdered metals at lower compaction pressures and lower temperatures (e.g., 520 MPa and 140° C., under 800 MPa and under 300° C.).

Particle interfaces in the cold sinter fuse together by the presence of the additional transport phase, thereby reducing the temperatures and pressures needed for compaction. Some embodiments involve the use of elements (e.g., phosphorous, boron, manganese, copper, sulfur etc.) to form a eutectic or perform cold welding at the desired low temperature, thereby stabilizing certain crystal structure shapes of isometric crystal systems, inducing rapid densification, and facilitating pore smoothing.

Embodiments of the process can involve a sintering process. The sintering process can be a cold sintering process. Embodiments of the cold sintering process can involve combining a metal compound, in particle form, with a solvent. The solvent can be selected to partially solubilize the metal compound to form a mixture. It is contemplated for the solvent to be an aqueous solution. Moderate pressure can be applied (e.g. 520 MPa or under 800 MPa) at low temperatures (e.g., 140° C. or under 300° C). to the mixture. The application of pressure and temperature can evaporate the solvent via a transient aqueous environment, leading to densification of the metal compound by a mediated dissolution-precipitation process. For instance, the application of pressure can provide the force needed to sinter the metal compound. The application of temperature can cause the solvent to evaporate, supersaturate any solubilized species, and densify the metal compound. The densification of the metal compound forms a sintered metal material. The resultant sintered metal material has a reduced porosity, which can lead to improved strength, conductivity, translucency, heat capacity, etc.

In some embodiments, water can be added to the solvent. During the sintering process, fluxes are generated in the mixture. The addition of water to the solvent can suppress the melting temperature of the fluxes when the pressure and temperature are applied. The solvent-metal mixture allows metal compound particles to be uniformly moisturized with a small amount of solvent so that solid surfaces of the metal compound decompose and partially dissolve in the solvent, thereby leading to a controlled amount of liquid phase being intentionally introduced at the particle-particle interface. This liquid phase is a low temperature liquid phase formed by the evaporation of the solvent. The high-temperature melt of metal material dissolves precursor material and then promotes nucleation, leading to growth of a crystal from the solution. Thus, the high-temperature melt of the metal compound functions as a solvent for crystallization. The water added to the solvent can suppress the melting point of many fluxes, resulting in a hydro-flux that spans the regime between flux growth and hydrothermal growth. These hydro-fluxes (e.g., hexahydroxometallate) can be used to generate a mass transport phase. For instance, the intersection of hydrothermal and flux-based crystal growth in the phase diagram introduces a mass transport phase at lower temperatures (at or near the boiling point of the solvent) that does not contain liquid water—i.e., the transport phase is non-aqueous solution. The combination of the added mass transport phase and the use of moderate pressures can enhance densification in materials when being sintered at relatively low temperatures.

It should be noted that the introduction of the solvent to the metal compound should be controlled so that dissolution of sharp edges of solid particles of the metal compound particles can reduce the interfacial areas, allowing for capillarity forces to aid in the rearrangement of the particles for the densification. With the assistance of sufficient external and capillary pressure, the liquid phase can redistribute itself and fill into the pores between the particles. Applying a uniaxial pressure, the solid particles can rearrange rapidly, which collectively leads to an initial densification. A subsequent growth stage (e.g., solution-precipitation), can be created through the evaporation of the solvent that enables the supersaturated state of the liquid phase at a low temperature (e.g., a temperature right above the boiling point of the solvent). This can trigger a large chemical driving force for the solid and liquid phases to reach high levels of densification.

With embodiments of the sintering process disclosed herein, dissolution and reprecipitation events facilitated by the mass transport phase can lead to porosity elimination and the formation of a dense microstructure for the sintered metal material. As will be demonstrated herein, particle interfaces in the cold sinter fuse together by the presence of the additional transport phase, thereby reducing the temperatures and pressures needed for compaction. Some embodiments involve the use of elements (e.g., phosphorous, boron, manganese, etc.) as a sintering aid to form an eutectic, thereby stabilizing certain crystal structure shapes of isometric crystal systems, inducing rapid densification, and facilitating pore smoothing.

In some embodiments, cold sintering aid can be an aqueous solution (<5 wt %) of an electroless plating solution that can deposit copper, silver, gold, manganese, iron etc. The cold sintering aid can be premixed to the desired metals that need to be cold sintered prior to the compaction. The resultant powder mixture when pressed at a compaction pressure (e.g. 520 MPa and 140° C.) promotes densification and yields high green strength. The process may involve cold welding of particles that provides significant enhancement in green strength and hardness.

In some embodiments, cold sintering aid can be a non-aqueous solution containing metallic salt solutions in organic solvents that are not limited to organic solvents such as Dimethyl formamide, Dimethyl sulfoxide, Tetrahydrofuran and ionic liquids such as Choline chloride. Other solvents include deep eutectic solvents that use a metal halide such as iron chloride, copper chloride etc. and quaternary ammonium salt, hydrated metal halide and choline chloride, metal halide and hydrogen bond donors such as amides, carboxylic acids and alcohols, etc.

In some embodiments, cold sintering aid can be a solution that assists hydrothermal or solvothermal process resulting in deposition of crystalline phase at the particle interfaces. During compaction under heat and pressure (e.g. 520 MPa and 140° C.), crystalline phases may be formed that bind the particles together.

In some embodiments, the sintering process can be used to generate a sintered composite. For instance, the cold sintering process can involve combining a first compound and a second compound with a solvent. Any one or combination of the first compound and the second compound can be in particle form. The first compound can be the same as or different from the second compound. It is contemplated for at least one of the first compound and the second compound to be a metal compound. For instance, the first compound can be a metal compound. The second compound can be an inorganic compound, an organic compound, a polymer, a metal, glass, carbon fiber, etc. The solvent can be selected to partially solubilize the first metal compound and/or the second metal compound to form a mixture. Pressure can be applied at low temperatures to the mixture. The application of pressure and temperature can evaporate the solvent via a transient aqueous environment, leading to densification of the first metal compound and the second metal compound to form a sintered composite material. It should be noted that any number of compounds can be used.

In some embodiments, the sintering process can be used to generate a sintered material on a substrate and/or a sintered composite on a substrate. For instance, the process can involve depositing the at least one metal compound onto a surface of a substrate. The substrate can be metal, ceramic, polymer, etc. The process can involve combining the at least one metal compound, in particle form, with a solvent before, during, and/or after depositing the at least one metal compound onto the surface of the substrate. The solvent can be selected to partially solubilize the at least one metal compound to form a mixture. Pressure can be applied at low temperatures to the mixture. The application of pressure and temperature can evaporate the solvent via a transient aqueous environment, leading to densification of the at least one metal compound to form a sintered material on the substrate and/or sintered composite on the substrate. It should be noted that more than one substrate can be used (e.g., a layered structure or a laminate structure can be formed). For instance, the process can involve depositing at least one metal compound onto a surface of a first substrate. The process can involve combining the at least one metal compound, in particle form, with a solvent before, during, and/or after depositing the at least one metal compound onto the surface of the first substrate. The solvent can be selected to partially solubilize the at least one metal compound to form a mixture. Pressure can be applied at low temperatures to the mixture. The application of pressure and temperature can evaporate the solvent via a transient aqueous environment, leading to densification of the at least one metal compound to form a sintered material and/or sintered composite on the first substrate. The process can involve forming a second substrate on the sintered material and/or the sintered composite. The process can involve depositing the at least one metal compound onto a surface of a second substrate. The process can involve combining the at least one metal compound, in particle form, with a solvent before, during, and/or after depositing the at least one metal compound onto the surface of the second substrate. The solvent can be selected to partially solubilize the at least one metal compound to form a mixture. Pressure can be applied at low temperatures to the mixture. The application of pressure and temperature can evaporate the solvent via a transient aqueous environment, leading to densification of the at least one metal compound to form a sintered material and/or sintered composite on the second substrate.

An exemplary method of carrying out an embodiment of the sintering process can involve converting a metal compound to powder form. The metal compound can be made into a fine powder, for example. The particle size can range from 1 nanometer to 100 micrometers. This can be achieved by milling the metal compound by ball milling, attrition milling, vibratory milling and jet milling, etc. In the alternative, or in addition, the metal compound can be mixed (using a mortar and pestle) with a small amount of acid dissolved in water (e.g., the acid and water content can range between 1-2 wt % of acid and 99-98 w % water.). The method can further involve combining the metal compound with a solvent. The method can further involve adding water to the solvent before, during, or after combining it with the metal compound. The method can further involve allowing the solvent to partially solubilize the metal compound to form a mixture. The method can further involve forming fluxes in the mixture. The method can further involve applying pressure to evaporate the solvent via a transient aqueous environment, leading to densification of the metal compound by a mediated dissolution-precipitation process. The method can further involve applying temperature to cause the solvent to evaporate, supersaturate any solubilized species, and densify the metal compound. For instance, the mixture can be placed on a die 102 of a press 100. The press 100 can be a constant pressure hydraulic press, for example. The press 100 can be secured to a load frame with the die 102. The die 102 can be configured to receive and retain a volume of the mixture. The press 100 can be actuated to impart pressure onto the mixture by advancing a hydraulic cylinder 104 towards the die 102. The die 102 and the load frame 106 can be configured to withstand the force of the hydraulic cylinder 104 so as to transfer the force to the mixture, thereby imparting pressure onto the mixture. It is contemplated for the pressures applied to be within the range from 50 MPa to 800 MPa. The application of pressure can aid in the sintering of the metal particles while the solvent evaporates. A heater band 108 can be coupled to the die 102, and be connected to an electrical power source for applying the heat to the die 102, which is transferred to the mixture when the mixture is placed therein. It is contemplated for the temperature applied to be within the range from 25° C. to 300° C. More specifically, the temperatures applied can be at or near the boiling point of the solvent. For instance, the temperature applied can be within a range from 0° C. to 200° C. above the boiling point of the solvent. The application of heat can cause the solvent to evaporate, supersaturate any solubilized species, and densify the metal compound to form the sintered material and/or the sintered composite.

The method can further involve, during the application of pressure and/or temperature, allowing the added water to suppress the melting temperature of the fluxes, causing solid surfaces of the metal compound to decompose and partially dissolve in the solvent. The method can further involve allowing the high-temperature melt of the metal material to dissolve precursor material and promote nucleation, leading to growth of a crystal from the solution. The method can further involve generating a hydro-flux that spans the regime between flux growth and hydrothermal growth so that the intersection of hydrothermal and flux-based crystal growth in the phase diagram introduces a mass transport phase at lower temperatures (at or near the boiling point of the solvent) that does not contain liquid water.

It is contemplated for the solvent to be an aqueous or non-aqueous solution of metallic salts. An example of a solvent can be an aqueous solution formed using metal sulfates such as 0.1M $CuSO_4$ and a chelating agent such as 0.1M Sodium citrate. Other aqueous metal salts will include metal halides, such as $FeCl_2$, $NiCl_2$, $MnCl_2$ etc or nitrates such as $Ni(NO_3)_2$, $AgNO_3$ etc. Chelating agents may include sodium citrate, sodium potassium tartrate, ethylenediamine tetra-acetic acid, porphyrine etc. In terms of non-aqueous solvents, organic solvents that are not limited to dimethyl formamide, tetrahydrofuran, dimethyl sulfoxide etc. can be used. Additionally, deep eutectic solvents of metal halides with choline chloride, metal halides with urea, metal halides with quaternary ammonium salts, metal halides with carboxylic acid, amines or alcohols can also be used.

It is contemplated for the metal compound to be any one or combination of iron, nickel, steel, stainless steel, copper, brass, bronze, copper-silver alloy, titanium, tantalum, silver, etc.

As noted herein, embodiments of the process can yield a green compact (e.g., a resultant sintered metal material) with a relative density of >90% of theoretical density (e.g., at least 95% of theoretical density). This can be achieved via densification through a dissolution precipitation mechanism at the interfaces of solid metal during compaction at relatively modest temperatures (e.g., 100° C. to 150° C.). It should be noted that embodiments of the sintering process can involve a dissolution-precipitation process that densifies interfaces in temperatures ranging from 25° C. to 300° C. and between 10-60 minutes of compaction time. The partial dissolution of the metal compound can be aided by the presence of very small amount of water (e.g., <2 wt %). In some embodiments, elements can be added to the mixture (e.g., phosphorous, boron, manganese, etc.) as a sintering aid to form a eutectic, thereby stabilizing certain crystal structure shapes of isometric crystal systems, inducing rapid densification, and facilitating pore smoothing. Test results indicate that the addition of these elements can improve hardness of the sintered metal material.

Figure 4:
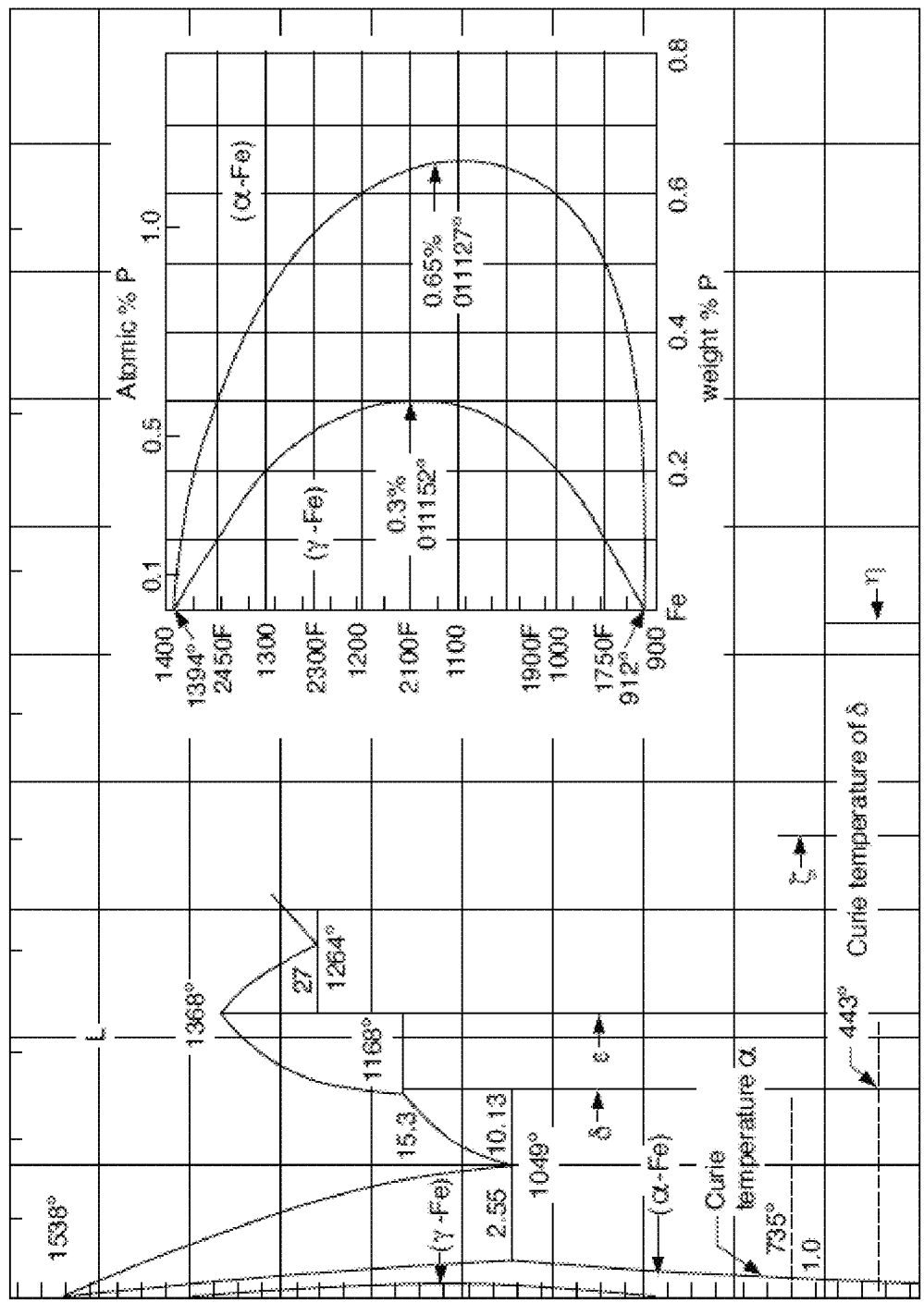
FIG. 4 shows an iron-phosphorus phase diagram.
Figure 5:
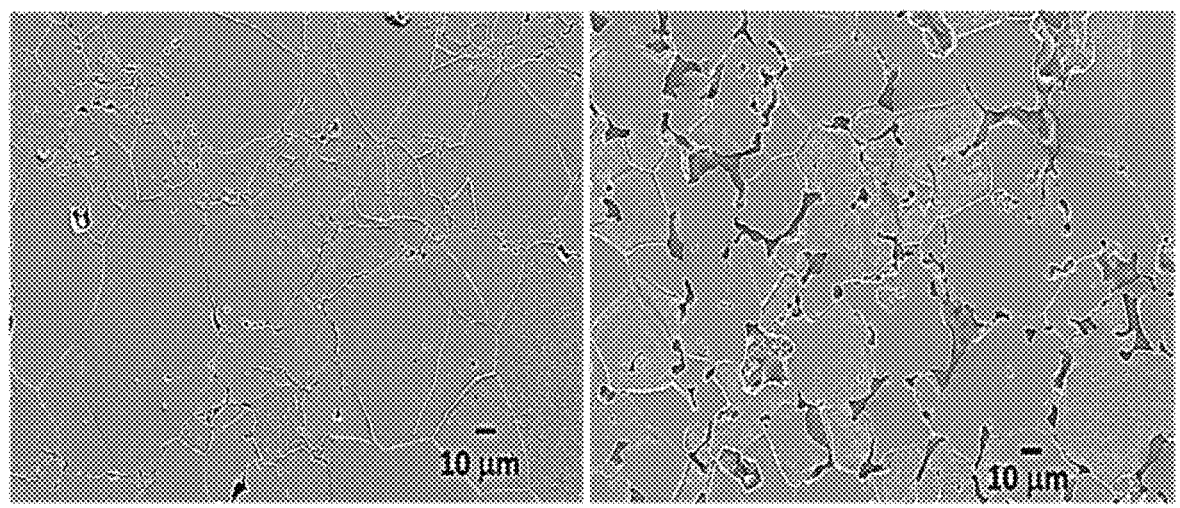
FIG. 5 shows the microstructure of a densified iron compound that had phosphorous added thereto as a sintering aid and the microstructure of a densified iron compound that did not have phosphorous added thereto compacted at 140° C. and 700 MPa for 20 min followed by post sintering at 1150° C. under 95% Nitrogen 5% Hydrogen atmosphere

For instance, an iron metal compound (e.g., 3-20 grams) was densified via an embodiment of the process (at 140° C. and 700 MPa for 10 s-20 minutes) with phosphorous element added (via 0.01-0.1 grams of phosphoric acid) to the mixture and was compared to a densified iron metal compound (e.g., 3-20 grams) via an embodiment of the process (at 140° C. and 700 MPa for 10 s-20 minutes) without phosphorous element added to the mixture. FIG. 4 shows an iron-phosphorus phase diagram for the densified iron compound that had phosphorous added thereto as a sintering aid post sintered at 1150° C. for 30 minutes under 95% Nitrogen 5% Hydrogen atmosphere. As seen in FIG. 4, phosphorus stabilized the body center cubic structure (BCC) and formed a liquid phase resulting in rapid densification and pore smoothing. Addition of phosphorus can thus act as a sintering aid. The phosphorous sintering aid can result in well-rounded pores (indication of excellent sintering) and large grain growth, as shown in FIG. 5. FIG. 5 shows the microstructure of the densified iron compound that had phosphorous added thereto as a cold sintering aid and the microstructure of the densified iron compound that did not have phosphorous added thereto post sintered at 1150° C. for 30 minutes under 95% Nitrogen 5% Hydrogen atmosphere. Phosphorus when introduced as a sintering aid without the application of pressure results in poor mixing that resulted in significant decrease in green strength, green density and transverse rupture strength of the sintered iron compound.

Figure 6:
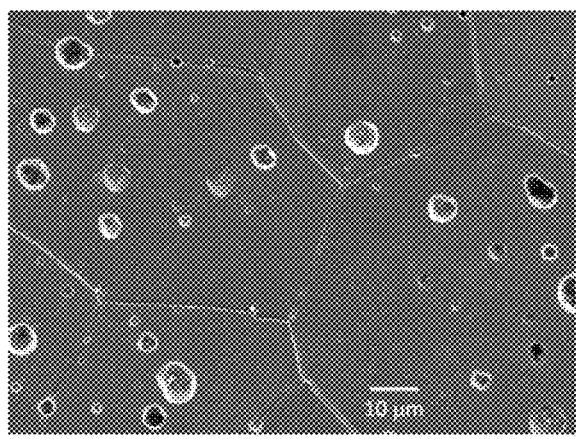
FIG. 6 shows the microstructure of a densified nickel compound that had phosphorous added thereto as a sintering aid and the microstructure of a densified nickel compound that did not have phosphorous added thereto compacted at 140° C. and 700 MPa for 20 min followed by post sintering at 1150° C. under 95% Nitrogen 5% Hydrogen atmosphere.
Figure 6:
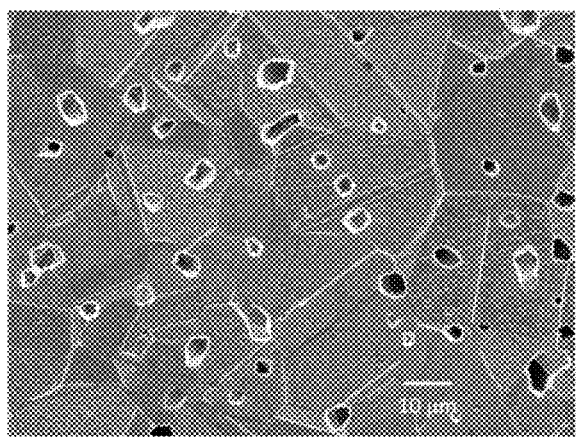
Figure 7:
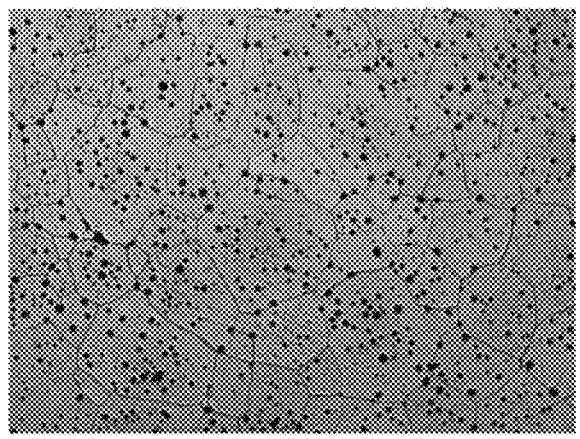
FIG. 7 shows another optical image of a densified nickel compound that had phosphorous added thereto as a sintering aid and another image of a densified nickel compound that did not have phosphorous added thereto compacted at 140° C. and 700 MPa for 20 min followed by post sintering at 1150° C. under 95% Nitrogen 5% Hydrogen atmosphere.
Figure 7:
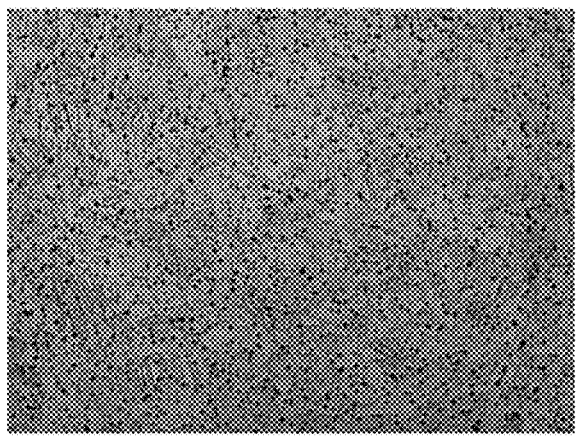

As another example, a nickel metal compound (e.g., 3-20 grams) was densified via an embodiment of the process (at 140° C. and 700 MPa for 10 s-20 minutes) with phosphorous element added (via 0.05-0.1 grams of phosphoric acid) to the mixture and was compared to a densified nickel metal compound (e.g., 3-20 grams) via an embodiment of the process (at 140° C. and 700 MPa for 10 s-20 minutes) without phosphorous element added to the mixture. Again, the addition of phosphorus can act as a sintering aid. The phosphorous sintering aid can result in well-rounded pores (indication of excellent sintering) and large grain growth, as shown in FIG. 6. FIG. 6 shows the microstructure of the densified nickel compound that had phosphorous added thereto as a sintering aid and the microstructure of the densified nickel compound that did not have phosphorous added thereto post sintered at 1150° C. for 30 minutes under 95% Nitrogen 5% Hydrogen atmosphere. The addition of phosphorus increases the grain size and also made well-rounded isolated pores, indicating excellent sintering. Referring to FIG. 7, in addition, the densified nickel compound that did not have phosphorous added thereto exhibited a significant amount of twinning (stacking faults) characteristic of sintered nickel that limits the grain growth, yet the densified nickel compound that had phosphorous added thereto as a sintering aid showed significant grain growth with limited amount of twinning, suggesting that the phosphorus acts as nucleation site for grain growth. In addition, phosphorus precipitates at the grain boundary are suggestive of precipitation hardening.

Figure 8:
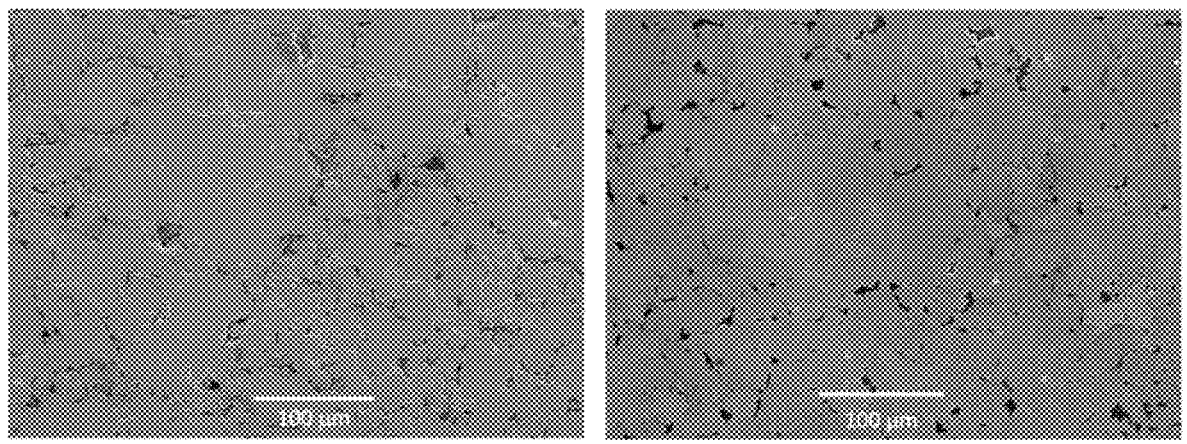
FIG. 8 shows the microstructure of a densified steel compound that had phosphorous added thereto as a sintering aid and a microstructure of the densified steel compound that did not have phosphorous added thereto compacted at 140° C. and 700 MPa for 20 min followed by post sintering at 1150° C. under 95% Nitrogen 5% Hydrogen atmosphere.

As another example, a steel (FC-0208) metal compound (e.g., 3-20 grams) was densified via an embodiment of the process (at 140° C. and 700 MPa for 10 s-20 minutes) with phosphorous element added (via 0.05-0.1 grams of phosphoric acid) to the mixture and was compared to a densified steel (FC-0208) metal compound (e.g., 3-20 grams) via an embodiment of the process (at 140° C. and 700 MPa for 10 s-20 minutes) without phosphorous element added to the mixture. Again, the addition of phosphorus can act as a sintering aid. The phosphorous sintering aid can result in well-rounded pores (indication of excellent sintering) and large grain growth, as shown in FIG. 8. FIG. 8 shows the microstructure of the densified steel compound that had phosphorous added thereto as a sintering aid and the microstructure of the densified steel compound that did not have phosphorous added thereto post sintered at 1150° C. for 30 minutes under 95% Nitrogen 5% Hydrogen atmosphere. The densified steel compound that did not have phosphorous added thereto shows the presence of both ferrite and carbide precipitation, whereas the densified steel compound that had phosphorous added thereto as a sintering aid exhibits stabilization of ferritic and cementite domain that is characteristic of formation of pearlite.

Figure 9:
FIG. 9 shows the microstructure of a densified brass compound that had phosphorous added thereto as a sintering aid and the microstructure of a densified brass compound that did not have phosphorous added thereto compacted at 140° C. and 700 MPa for 20 min followed by post sintering at 850° C. under 95% Nitrogen 5% Hydrogen atmosphere.
Figure 9:
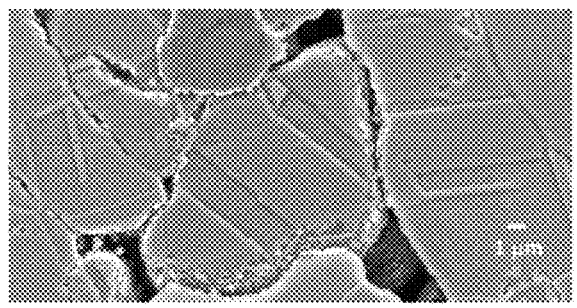

As another example, a brass metal compound (e.g., 3-20 grams) was densified via an embodiment of the process (at 140° C. and 700 MPa for 10 s-20 minutes) with phosphorous element added (via 0.05 grams of phosphoric acid) to the mixture and was compared to a densified brass metal compound (e.g., 3 grams) via an embodiment of the process (at 140° C. and 700 MPa for 10 s-20 minutes) without phosphorous element added to the mixture. Again, the addition of phosphorus can act as a sintering aid. The phosphorous sintering aid can result in well-rounded pores (indication of excellent sintering) and large grain growth, as shown in FIG. 9. FIG. 9 shows the microstructure of the densified brass compound that had phosphorous added thereto as a sintering aid and the microstructure of the densified brass compound that did not have phosphorous added thereto post sintered at 850° C. for 30 minutes under 95% Nitrogen 5% Hydrogen atmosphere.

Figure 10:
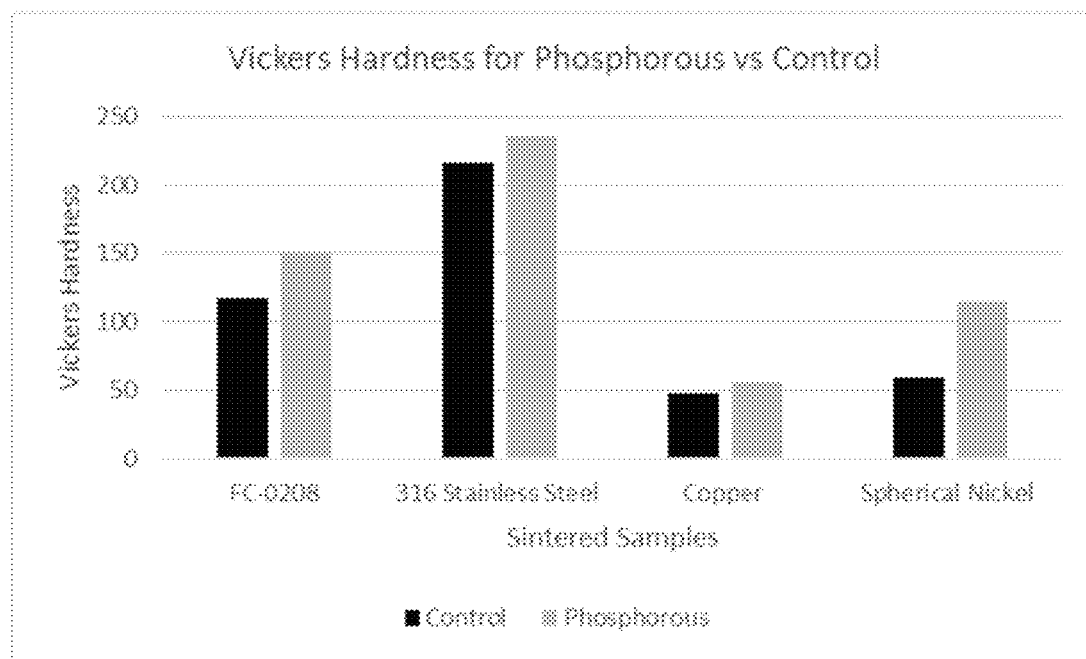
FIG. 10 shows Vickers hardness test results for various metal compounds that were densified via an embodiment of the process as compared to metal compounds that were densified using conventional methods.
Figure 11:
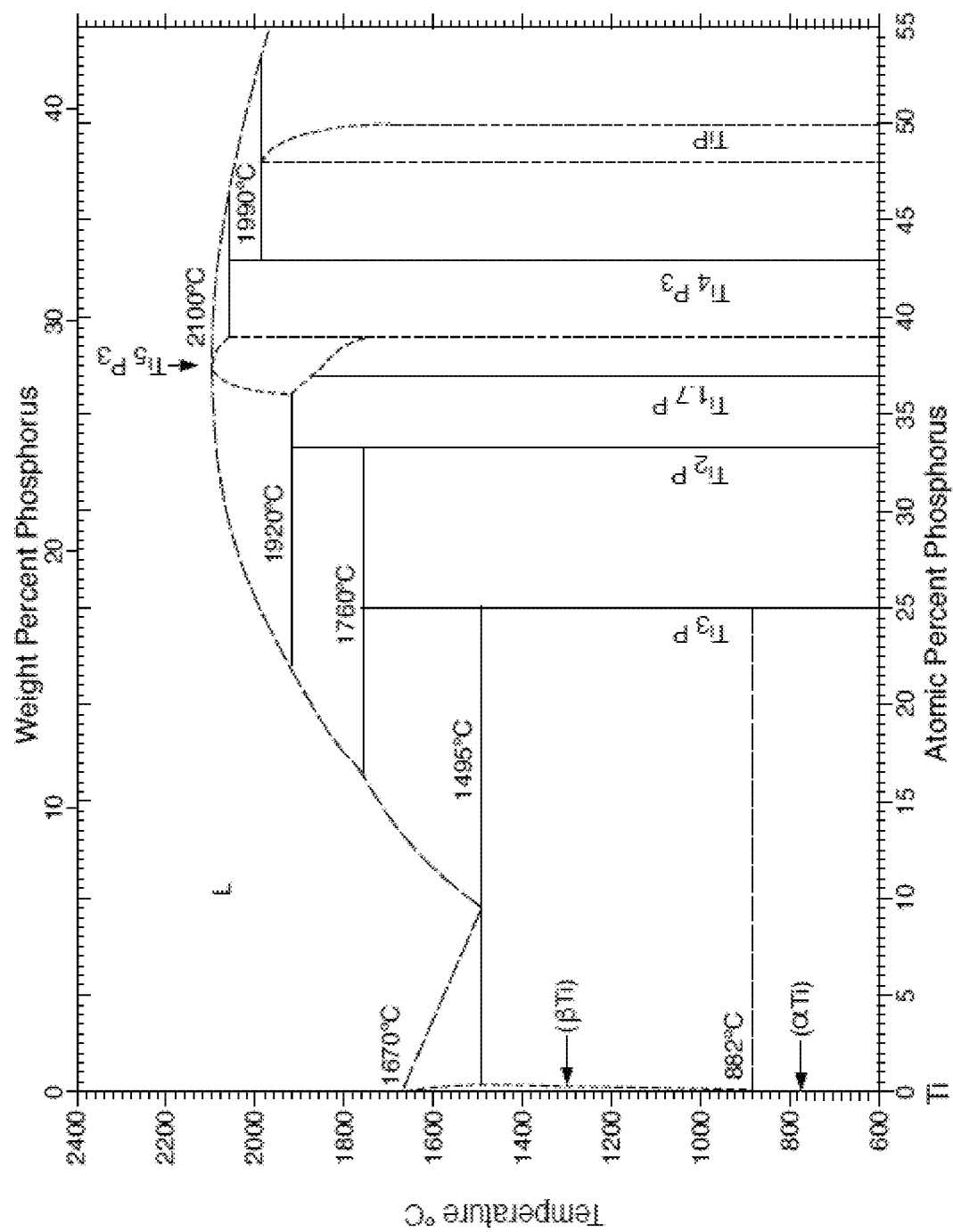
FIG. 11 shows a titanium-phosphorus phase diagram.
Figure 12:
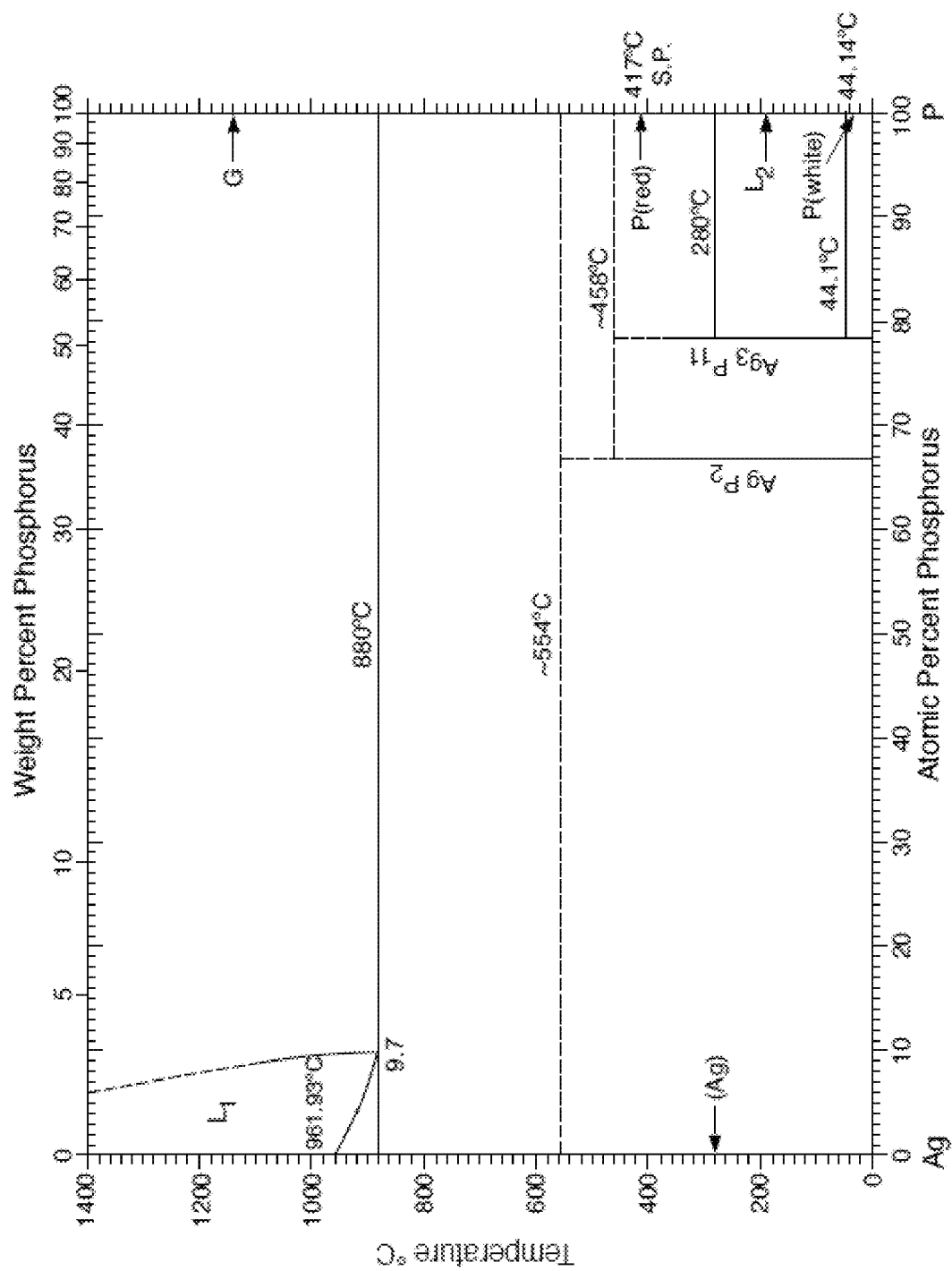
FIG. 12 shows a silver-phosphorus phase diagram.

Referring to FIG. 10, Vickers hardness tests for various metal compounds tested confirm that phosphorous as a sintering aid improved the hardness of the densified materials. It is contemplated that phosphorus as a sintering aid can work with titanium metal compounds and silver metal compounds, as evidenced form the titanium-phosphorus (see FIG. 11) and silver-phosphorus (see FIG. 12) phase diagrams.

Figure 13:
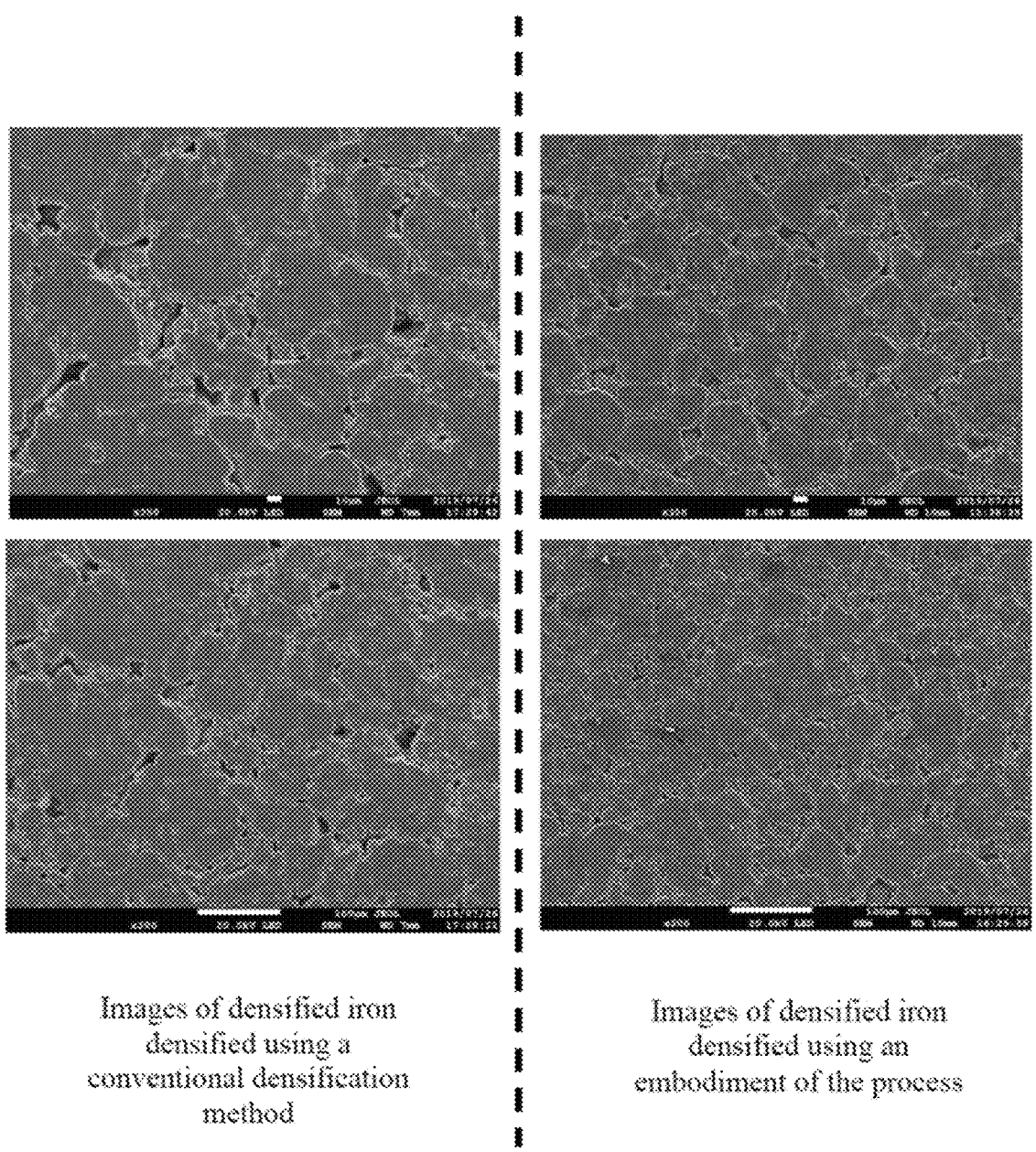
FIG. 13 shows an image of a densified iron compound that was densified using an embodiment of the process (700 MPa using 0.1 wt % of $CuSO_4$/Sodium citrate aqueous solution at 140° C.) compared to an iron metal sample densified via conventional sintering method.
Figure 14:
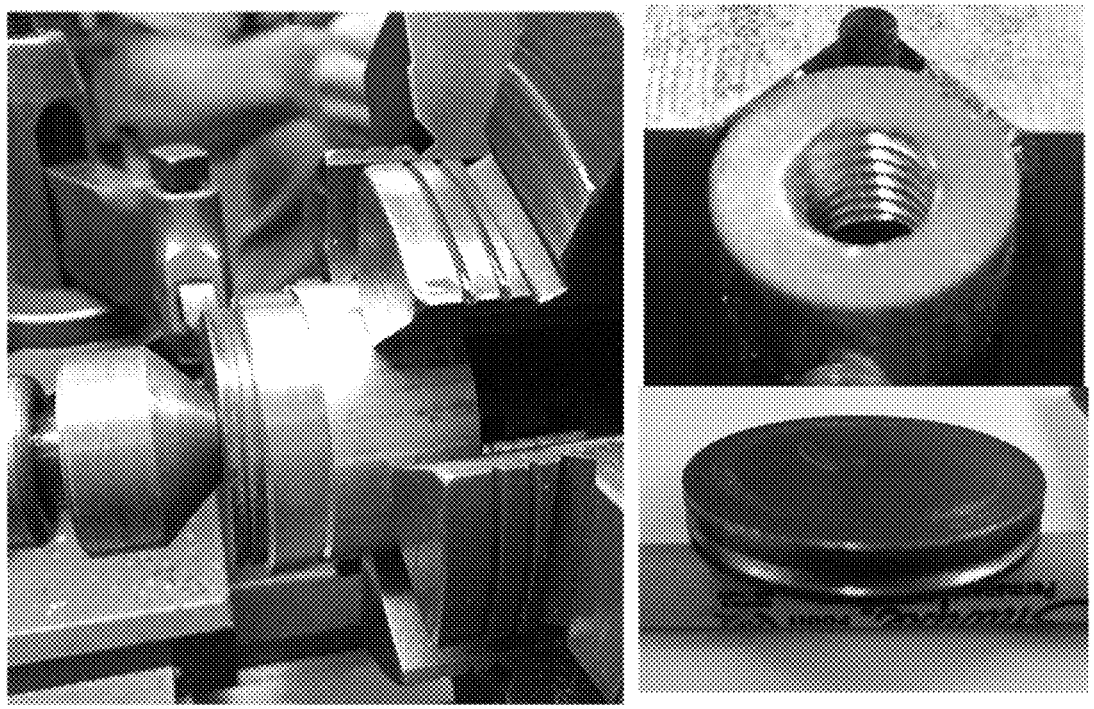
FIG. 14 shows a densified iron compound that was densified using an embodiment of the process (700 MPa using 0.1 wt % of $CuSO_4$/Sodium citrate aqueous solution at 140° C.) undergoing turning, drilling and tapping process to produce a threaded compact and a grooved compact.
Figure 15:
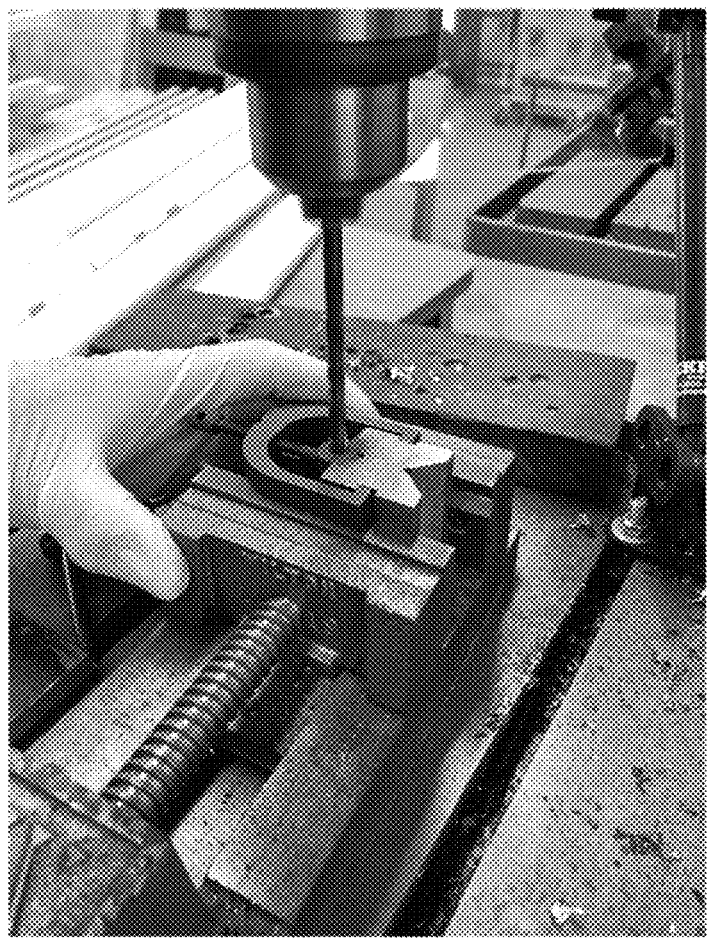
FIG. 15 demonstrating sufficient strength of densified iron compound densified iron compound that was densified using an embodiment of the process (700 MPa using 0.1 wt % of $CuSO_4$/Sodium citrate aqueous solution at 140° C.) as compared to warm compacted control and its ability to produce a drilled hole.
Figure 15:
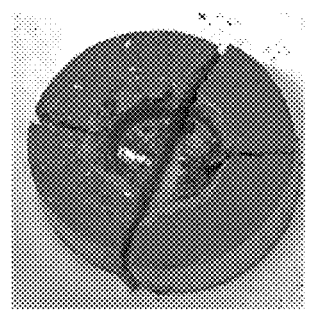
Figure 15:
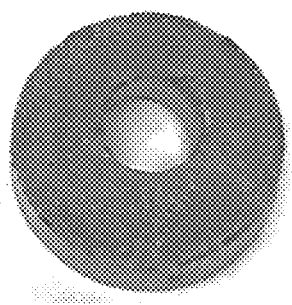

Test results indicate that the dissolution-precipitation mechanism of the process can lead to better consolidation at the particle-particle interface. For instance, the particle interfaces appear fused together by the presence of additional phase. Sintered metal samples made via an embodiment of the process appear to be more fully sintered when compared to conventional sintering methods—i.e., individual particles in the conventional samples are visible while the samples made via an embodiment of the process shows diffusion bonding between the particles, which is a clear evidence of a well-sintered part. In addition, the samples made via an embodiment of the process show a uniform, smaller porosity throughout the sample, exhibit higher hardness values (attributed to smaller rounded porosity), and improved green strength and green hardness at lower compaction pressures (e.g., 25% lower pressures can be used for embodiments of the process as compared to conventional methods—improving green strength minimizes tooling stresses and increases robustness of green samples because it is generally difficult to machine parts after they have been sinter hardened via conventional methods). For example, FIG. 13 shows an image of a densified iron compound that was densified using an embodiment of the process (700 MPa using 0.1 wt % of $CuSO_4$/Sodium citrate aqueous solution at 140° C.) compared to an iron metal sample densified via conventional sintering method. The densified iron compound that was densified using an embodiment of the process demonstrates better particle consolidation and imparts enough green strength for green machining to be possible. FIGS. 14 and 15 demonstrates the machinability of cold sintered iron compact (only at 140° C.). Various machining operations that include drilling, cutting, turning and tapping has been demonstrated. The compacts demonstrate ample green strength to make the green machining possible. The methodology can also be applied to other electroless plating chemistries that are not limited to silver, tin, copper, nickel, cobalt and manganese.

These improvements can increase uniform density of complex parts being made via sintering, enhance load carrying capacity of sintered parts under dynamic and fatigue loads, provide the ability to introduce additives at interfaces (as necessary), suppress formation of intermetallics at grain boundaries, and lower sintering temperatures for some metals. Some of these improvements can be seen from Table 1 below.

TABLE 1

Processing temperature, compaction pressure, and relative density of exemplary metals that were densified via an embodiment of the process.

| Sample | Processing temperature (° C.) | Compaction Pressure (MPa) | Relative density (%) |
|---|---|---|---|
| Coper (control) | 25 | 520 | 81 |
| | 140 | 520 | 88 |
| | 300 | 520 | 94 |
| Copper (with acetic acid) | 140 | 520 | 90 |
| | 300 | 520 | 95 |
| Iron (control) | 25 | 700 | 93 |
| | 140 | 520 | 84 |
| | 140 | 700 | 96 |
| Iron (with phosphoric acid) | 140 | 520 | 90 |
| | 140 | 700 | 95 |

Figure 16:
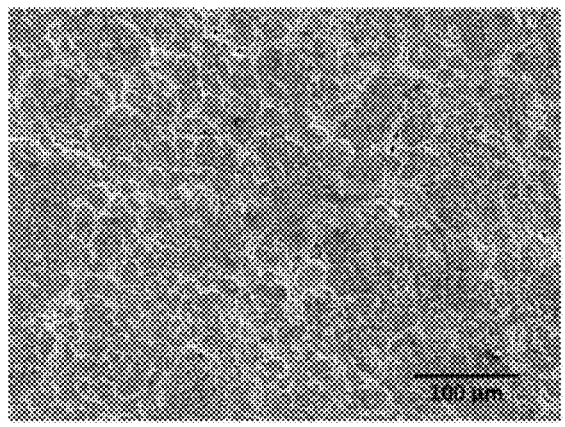
FIG. 16 shows a morphology of copper powder compacted at 140° C. at 520 MPa for 90 min ("control") and copper powder with 2 wt % acetic acid and 2 wt % water compacted at 140° C. at 520 MPa for 90 min ("sintered via an embodiment of the process").
Figure 16:
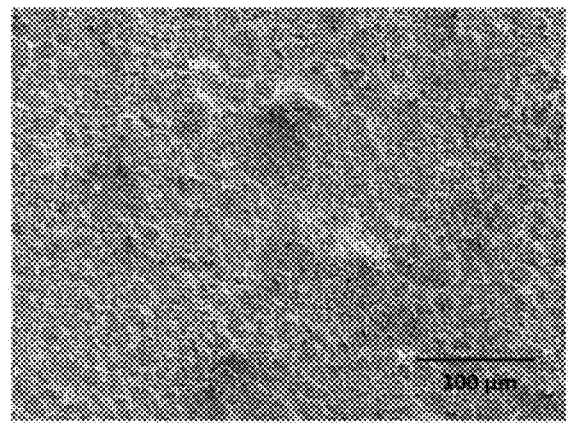
Figure 17:
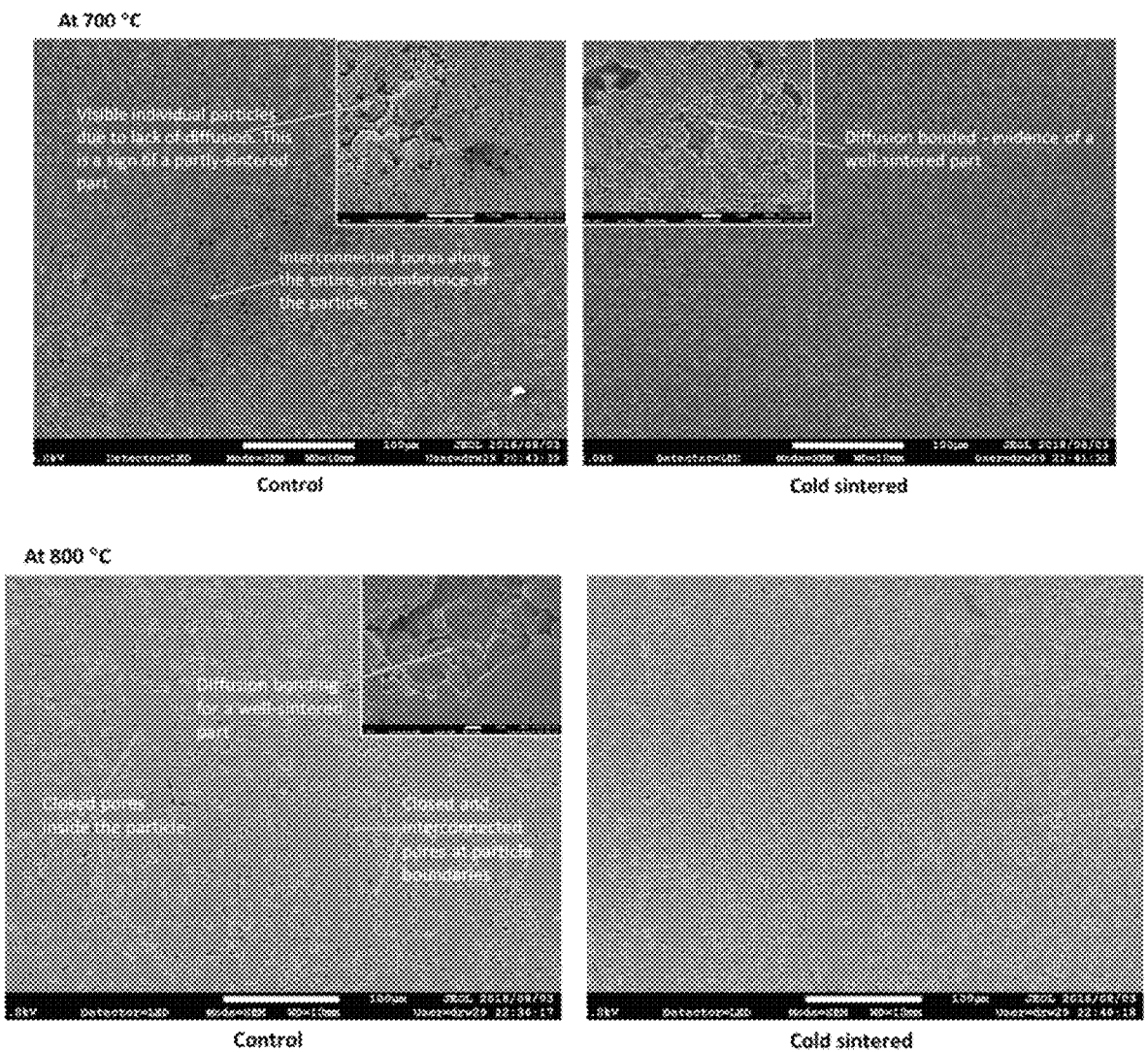
FIG. 17 shows the impact of cold sintered compaction on high temperature sintering that can be realized by tracking the sintered morphology as a function of temperature.
Figure 18:
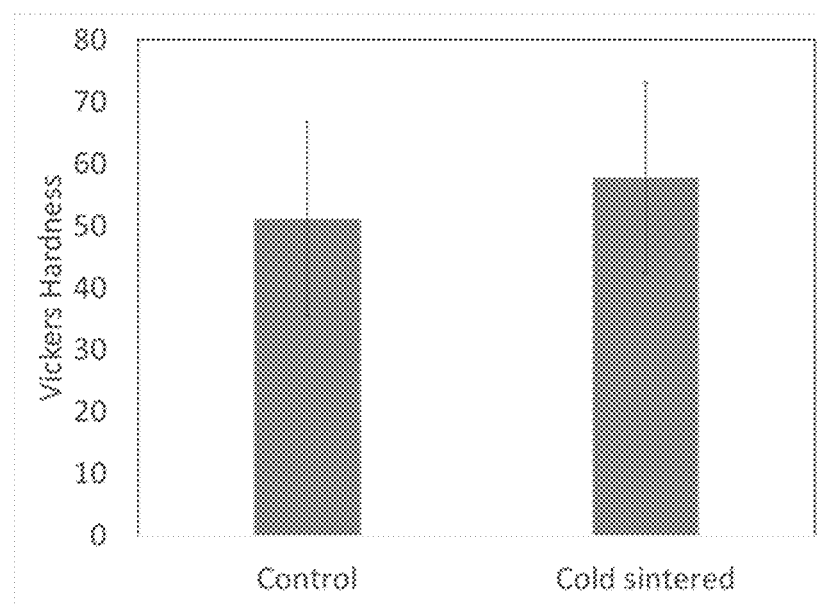
FIG. 18 shows Vickers hardness results of a control sample compared to a sample made from an embodiment of the process.

FIG. 16 shows a morphology of copper powder compacted at 140° C. at 520 MPa for 90 min ("control") and copper powder with 2 wt % acetic acid and 2 wt % water compacted at 140° C. at 520 MPa for 90 min ("sintered via an embodiment of the process"). Comparison of compacted copper powders for these two samples indicate that dissolution-precipitation mechanism is what leads to better consolidation at the particle-particle interface. For instance, the particle interfaces appear fused together by the presence of additional phase. The impact of cold sintered compaction on high temperature sintering can be realized by tracking the sintered morphology as a function of temperature (see FIG. 17). At 700° C., the control shows partial sintering while the sample made from an embodiment of the process appears fully sintered. The individual particles are still visible in the control sample while the sample made from an embodiment of the process shows diffusion bonding between the particles, which is clear evidence of well-sintered part. At 800° C., both the samples appear well sintered, but the sample made from an embodiment of the process showed uniform smaller porosity throughout the sample. FIG. 18 shows Vickers hardness results of the control sample compared to the sample made from an embodiment of the process. Both the samples were compacted at 140° C. at 520 MPa. Values are reported based on 15 data points.

Figure 19:
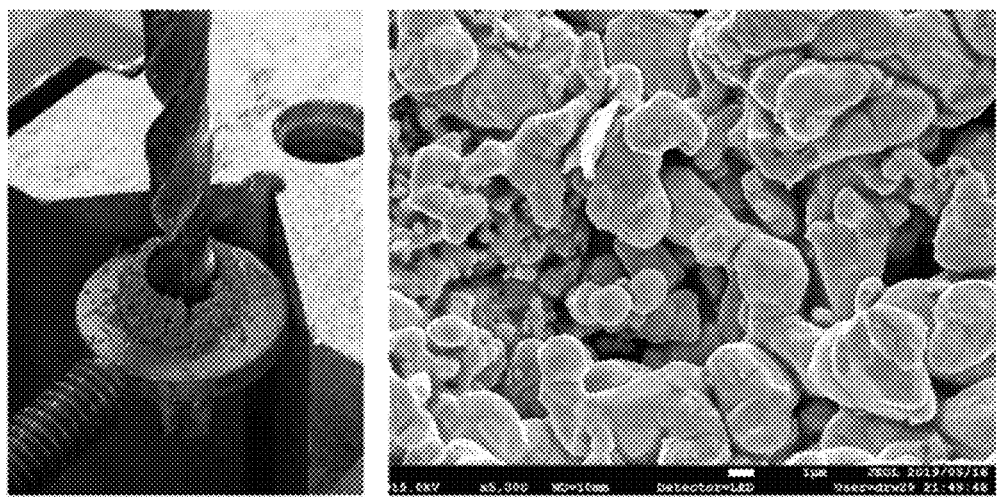
FIG. 19 shows the impact of densified tantalum with a density of 10.5 g/cc densified using an embodiment of the process (100 MPa using 2 wt % Phosphoric acid at 140° C.) on machinability.

As another example, tantalum powder (e.g., 3 grams) was densified via an embodiment of the process (at 140° C. and 700 MPa for 20 minutes) with phosphorous element added (via 0.1 grams of phosphoric acid) to the mixture. Again, the addition of phosphorus can act as a sintering aid. The cold sintered tantalum pellet (density of 13.6 g/cc ~82% relative density) had sufficient green strength that enabled drilling of holes. The compaction pressure could also be varied by reducing to 100 MPa in order to produce a porous tantalum pellet with a green density of 10.5 g/cc (~62% Relative density) that can be machined as shown in FIG. 19.

Figure 20:
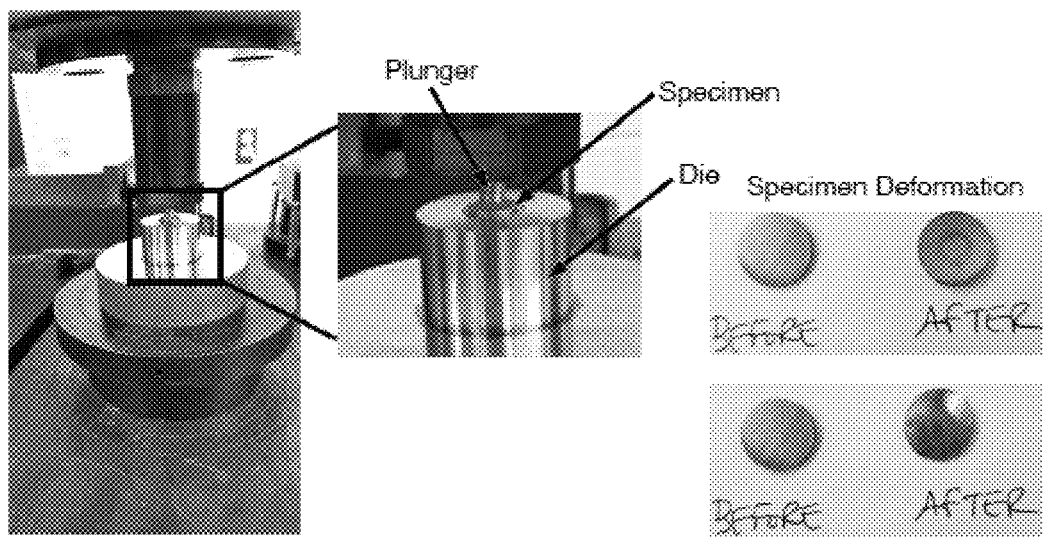
FIG. 20 shows the impact of cold sintered compaction on improvement in Elastic and Young's modulus of a densified iron compound using an embodiment of the process (140° C. and 700 MPa for 20 min) followed by post sintering at 1150° C. for 30 min under 95% Nitrogen 5% Hydrogen atmosphere.
Figure 20:
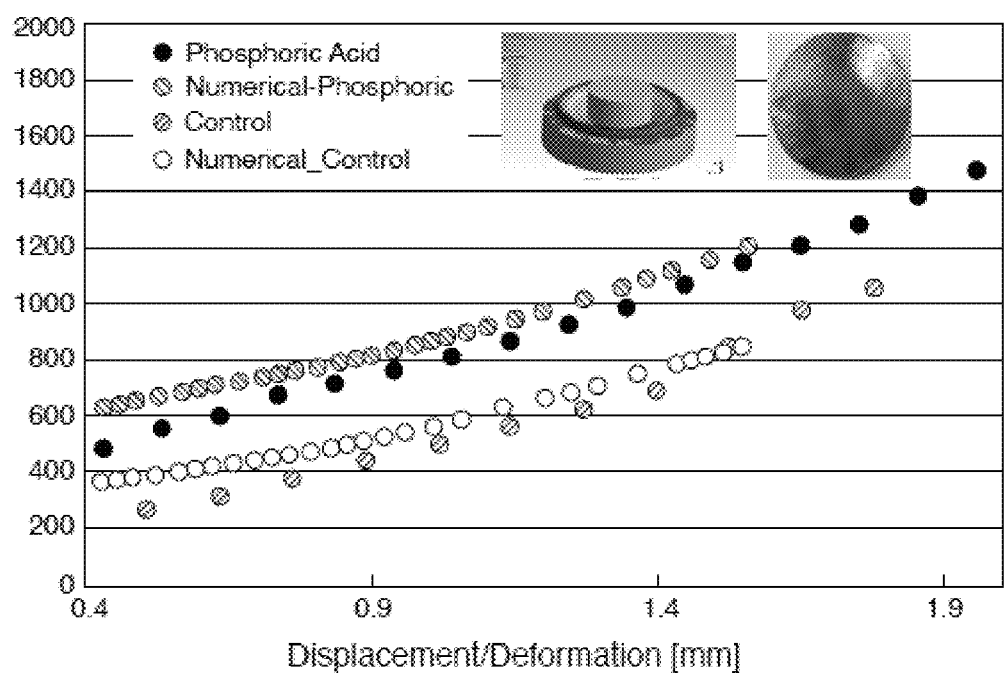

FIG. 20 shows the Circular plate bending of sintered iron discs were used to compare the mechanical properties of warm compacted control and cold sintering iron post sintered at 1150° C. FIG. 20 summarizes the results of circular plate bending test analyzed using ANSYS of iron powder (e.g., 3 grams) densified via an embodiment of the process (at 140° C. and 700 MPa for 10 s-20 minutes) with phosphorus element added (via 0.1 grams of phosphoric acid) to the mixture. Again the addition of phosphorus can act as a sintering aid. The samples were then post heat treated at 1150° C. under 95% Nitrogen 5% Hydrogen atmosphere for 30 minutes. Cold sintering conditions improve both the elastic modulus and yield strength of iron by almost 160% as shown in Table 2.

TABLE 2

Comparison of mechanical properties of warm compacted iron without phosphorus and cold sintered iron sample with phosphorus post sintered at 1150° C.

| Specimen | Elastic Modulus | Poisson's Ratio | Yield Strength | Tangent Modulus |
|---|---|---|---|---|
| Control - Warm Compacted | 100 GPa | 0.3 | 100 MPa | 1450 MPa |
| Cold sintered Phosphoric acid | 160 GPa | 0.3 | 15 MPa | 1200 MPa |

Figure 21:
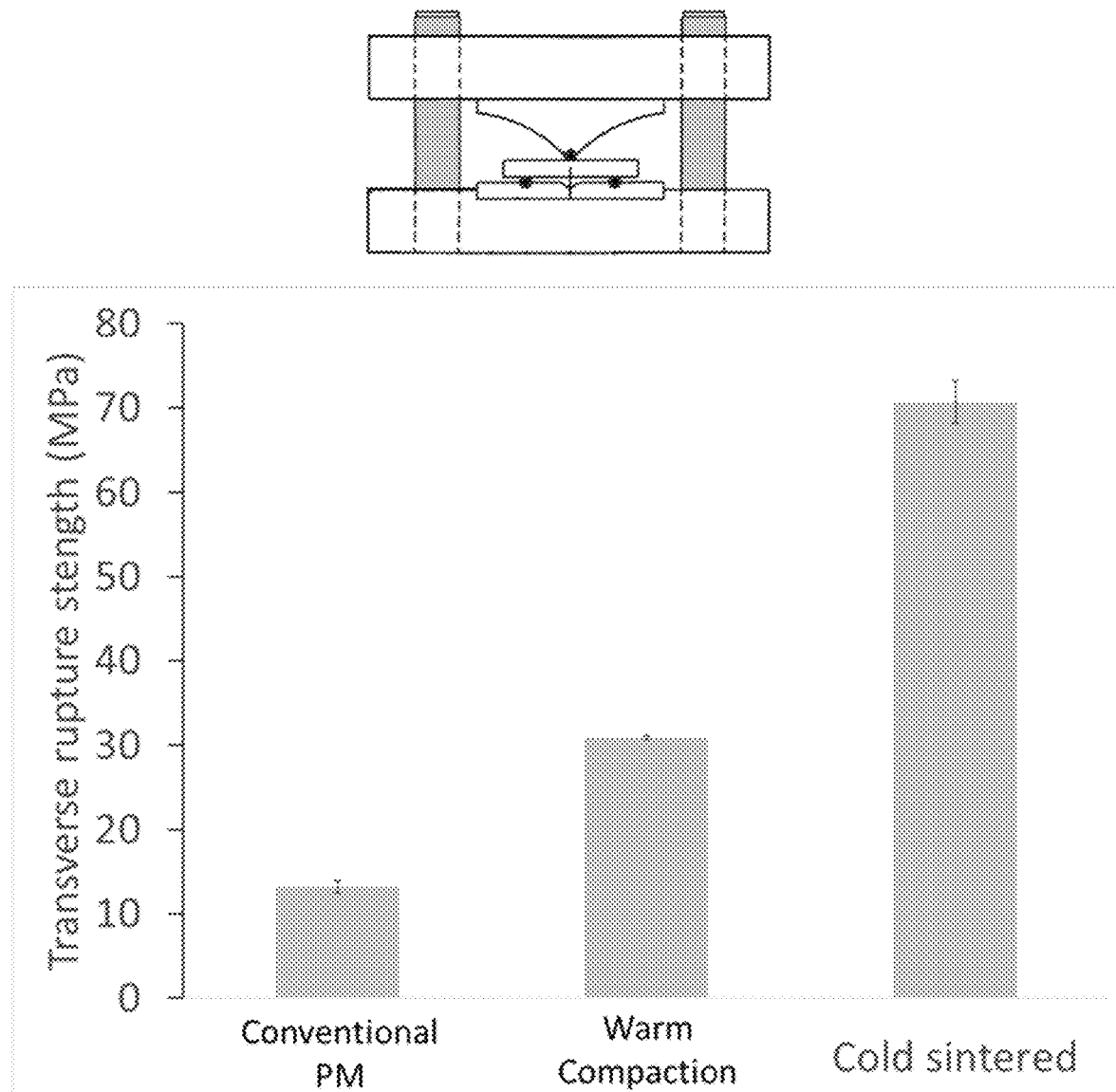
FIG. 21 shows the comparison of the transverse rupture strength (TRS) measured using 3-point bending measurements.

FIG. 21 shows the comparison of the transverse rupture strength (TRS) measured using 3-point bending measurements. The TRS bars (1.25" L×0.5" B×0.25" H) with relative density >90% were made using iron powder (eg., 18 grams) densified via an embodiment of the process (at 140° C. and 700 MPa for 10 s) with phosphorus element added (via 0.01-0.2 grams of phosphoric acid) to the mixture. Again the addition of phosphorus can act as a sintering aid. FIG. 21 shows the comparison of average of five TRS measurements of cold sintered compacts against warm compacted and conventional PM compacted controls. The results show that the transverse rupture strength of cold sintered compact was ~71 MPa as compared to 31 MPa and 14 MPa for warm compacted control and conventional PM process, respectively. This shows an increase in strength of ~five times that of conventional PM process and two times that of warm compaction process.

Figure 22:
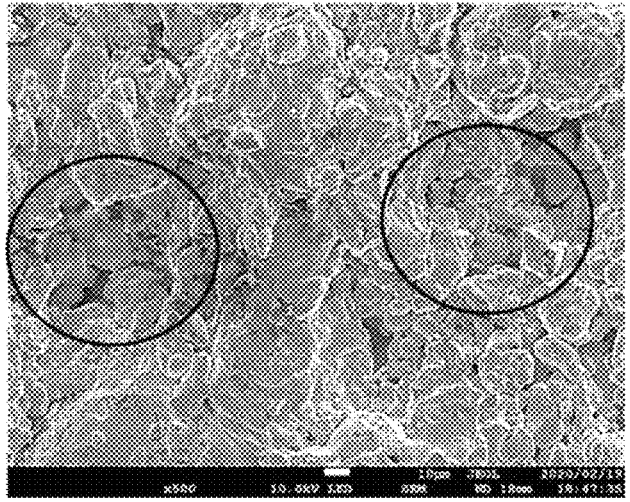
FIG. 22 shows the scanning electron micrograph image of fractured surface of TRS sample of warm compacted control that shows the presence of individual loose particles on the fractured surface indicating intergranular fracture as the dominant mode of failure.
Figure 22:
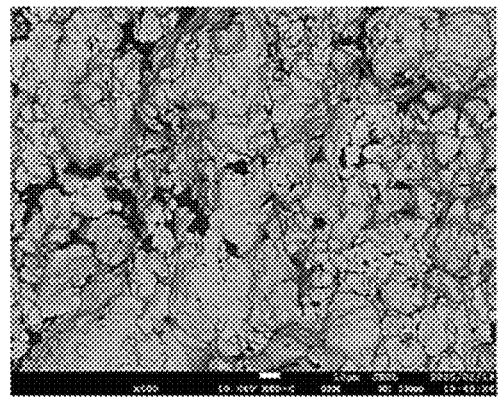
Figure 22:
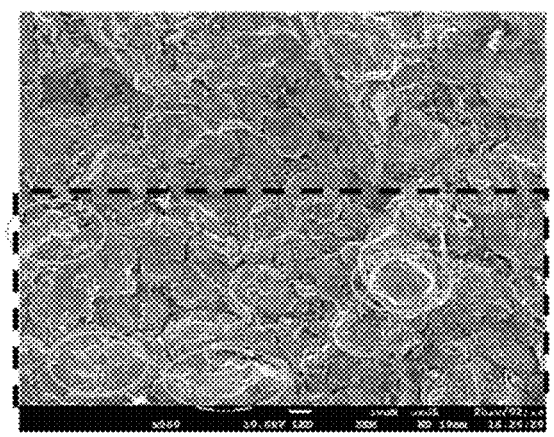
Figure 22:
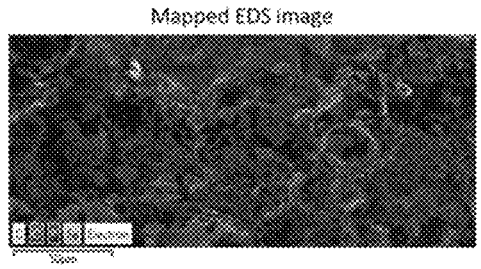
Figure 22:
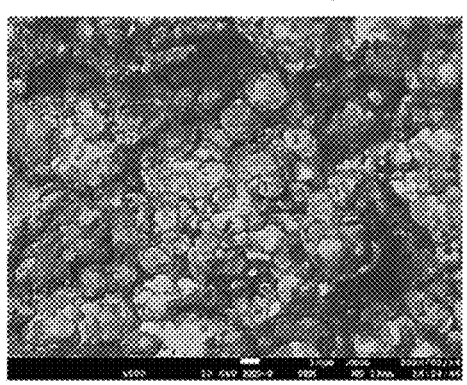

FIG. 22 shows the scanning electron micrograph image of fractured surface of TRS sample of warm compacted control that shows the presence of individual loose particles on the fractured surface indicating intergranular fracture as the dominant mode of failure. The scanning electron micrograph image of fractured surface of TRS sample of cold sintered iron compact show evidence of shearing and transgranular fracture indicating stronger bonding at the particle interface.

Figure 23:
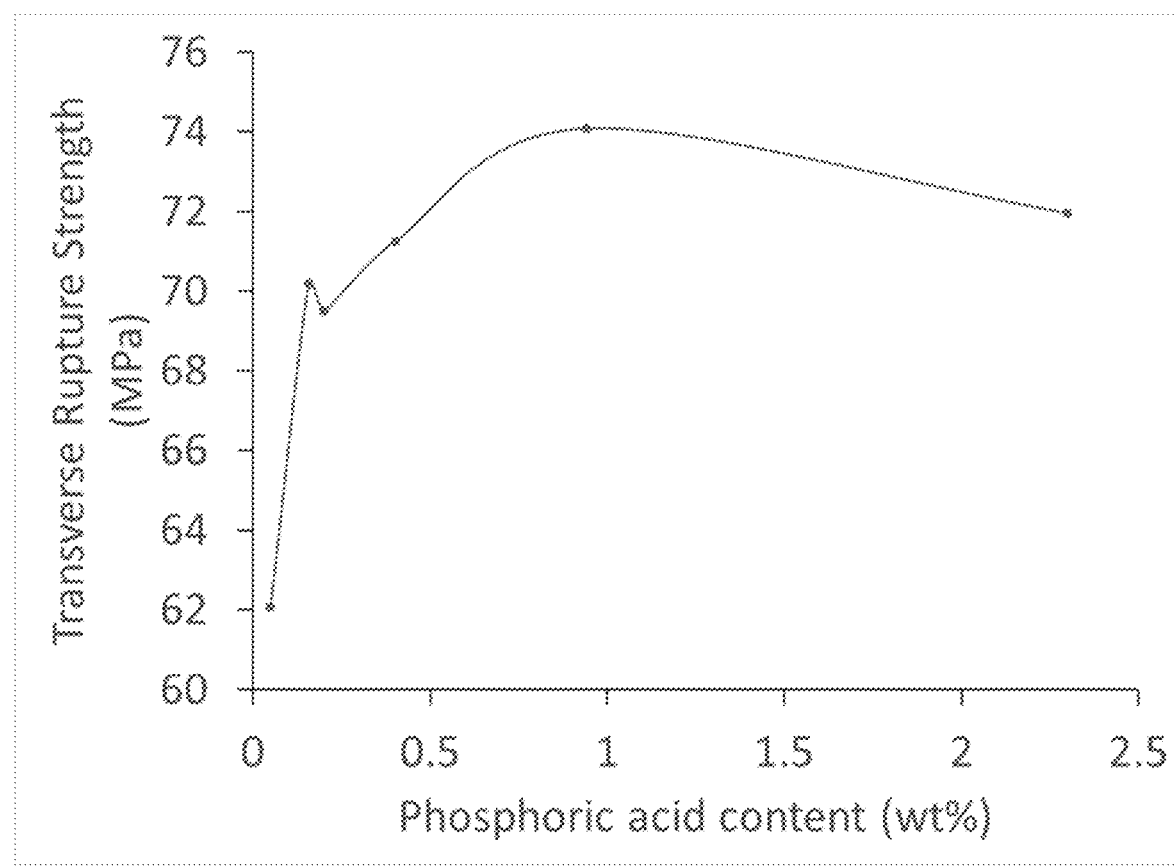
FIG. 23 shows the impact of concentration of phosphorus additive on the TRS strength of cold sintered compacts.

FIG. 23 shows the impact of concentration of phosphorus additive on the TRS strength of cold sintered compacts. There seems to be an optimum phosphorus concentration beyond which the strength of the compact diminishes. The optimum strength was obtained at a phosphoric acid content of ~1 wt % (Note: ACS reagent phosphoric acid was used which only contained 35 wt % acid in water).

Figure 24:
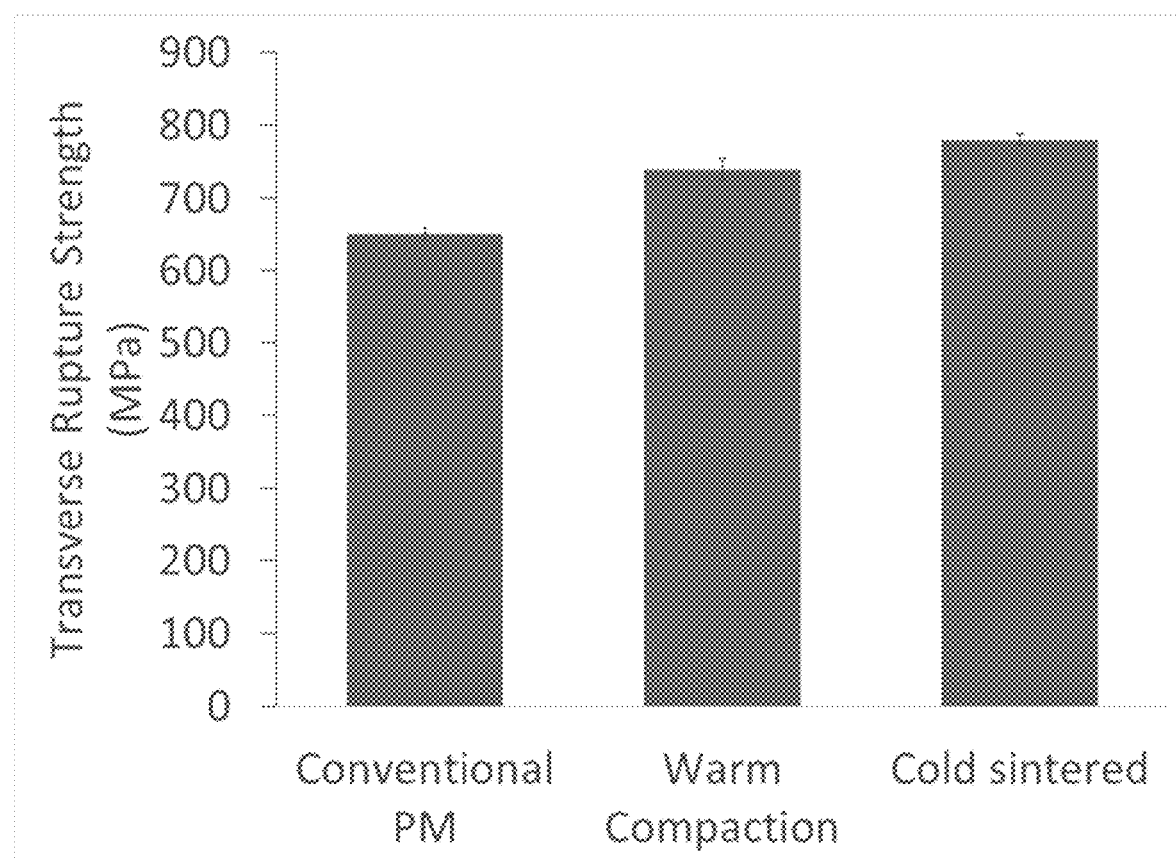
FIG. 24 shows the comparison of Transverse rupture strength of samples post heat treated at 1150° C. under 95% Nitrogen 5% Hydrogen atmosphere for 30 minutes after cold sintering.

FIG. 24 shows the comparison of Transverse rupture strength of samples post heat treated at 1150° C. under 95% Nitrogen 5% Hydrogen atmosphere for 30 minutes after cold sintering. The samples containing phosphoric acid content 0.05-1 wt % show improvement in Transverse rupture strength relative to warm compacted control and conventional compact subjected to similar sintering conditions. Transverse rupture strength of conventional PM process, Warm compaction process and Cold sintered process were 651 MPa, 740 MPa and 780 MPa, respectively.

In an exemplary embodiment, a method of forming a densified material can involve combining a solvent with a metal compound to form a mixture. Water can be added to the solvent before, during, or after combining the solvent with the metal compound to form an aqueous solution. Fluxes can be allowed to form in the mixture. Pressure can be applied to evaporate the solvent via a transient aqueous environment, leading to densification of the metal compound by a mediated dissolution-precipitation process. Temperature can be applied to cause the solvent to further evaporate, supersaturate any solubilized species, and densify the metal compound. The method can result in generating a densified material that is >90% the theoretical density for the metal compound. The generated densified material is machinable. For instance, machining operations can be performed on the generated densified material, such forming the densified material into a cold sintered pellet, and one or more of the following: drilling a hole through the cold sintered metal pellet; taping or threading the cold sintered metal pellet; and performing a turning operation on the cold sintered pellet on a lathe. In some embodiments, the method can involve: depositing a metal or a compound at metal interfaces of the metal compound to promote bonding between particles; sinter bonding at low temperatures with metal components to add functionality; cold sintering the metal compound to improve strength, hardness, and/or toughness; cold sintering the metal compound with the addition of polymeric materials; infiltrating with low temperature eutectic alloys; and/or vacuum impregnating with sealant.

The surface of iron powder has been modified using phosphoric acid to facilitate a low temperature densification and strengthening process under warm compaction. Cold sintering of the compacts results in a co-continuous phosphate interphase between iron particles that provide both enhanced green strength and green density similar to the process that has been successfully introduced in low temperature densification of ceramic materials. Relative density as high as 95% along with transverse rupture strength of ~75 MPa, which is almost six times that of conventional powdered metal iron compact and 2.5 times that of warm compacted controls was achieved. Dilatometry study at different pressures showed a small but significant improvement in densification process during cold sintering relative to the larger densification of conventional warm compaction. Strength model based on microstructural analysis as well as in situ DRIFTS experiments revealed the nature of the interphase that imparted the large cohesive strength under the cold sintered assisted warm compaction. The process was conducive to produce iron compacts for green machining and various machining operations have been demonstrated. Furthermore, the samples when subjected to high temperature sintering yielded a fully sintered iron compact with density >7.2 g cm$^{-3}$ and transverse rupture strength as high as 780 MPa. All in all, there are major new opportunities with the cold sintered assisted warm compaction of powdered metals, that will also be discussed.

Powdered metal processing is a well-established manufacturing technology that utilizes optimum amount of energy and materials to transform a pressed powdered metal of desired net shape to a sintered metal component. Green strength is an important property that determines the production rate and allow the handling of the parts prior to conventional high temperature sintering. Higher green strength is also paramount for green machining in P/M processes which can significantly improve tool life and ability to make complex parts using sinter hardenable materials. However, this requires the green strength of powdered compacts to be greater than 20-30 MPa, which is at least twice that of conventional P/M compacts. Additionally, P/M manufacturing of soft magnetic composites are gaining prominence and the ability to produce highly dense green or partially sintered iron compacts with insulating boundaries and enhanced mechanical strength can potentially open new P/M processing route for manufacture of components for electrical motor segments.

Green strength and green density of P/M compacts are largely impacted by three powder variables that include geometric factors such as particle size and shape; surface area and roughness; intrinsic factors such as impurities or oxide layer and surface related features such as adsorbed species and lubricants. It has also been shown that the use of lubricants from classes of silanes, titanates, aluminates, zirconates can result in an insulating inorganic coating on iron powders that can yield 95% relative density at a compaction pressure above 800 MPa. Surface treatment has also shown improvement in the green strength. Several groups have shown that copper coated iron powders can improve the green strength. Improved surface roughness for mechanical interlocking and cold welding has been considered as the dominant mechanism to increase the green strength. Increase in green strength has also been accomplished using special polymeric lubricants. The higher strength due to the addition of polymeric lubricants are attributed to their better intrinsic mechanical properties as compared to conventional metallic stearates or ethylene bis stearamide (EBS) wax lubricants. In particular, strong intermolecular interactions that are aided by either acid base interactions or strong polar groups with sufficiently high molecular weight favor the formation of a thin and strong film that adheres to the metal particles and strengthens the green compact.

From a process point of view, warm compaction and warm die compaction are two industrially viable routes to further improve green strength and green density. Warm compaction is a process in which both the die and the powder are heated to a modest temperature of ~100° C. In this process, heat is used to lower the yield point of metal particles, thereby facilitating deformation and increasing the compressibility of material. In the case of warm die compaction, only the die is heated and as such the temperatures achieved using this process are relatively lower. However, this process has been useful to decrease the lubricant content as it softens more quickly relative to conventional room temperature compaction. More recently, various additive manufacturing technology that include material jetting, binder jetting, sheet lamination, direct energy deposition and powder bed fusion have also been used to improve green density. Particle size, shape and distribution as well as binder composition are some of the material parameters that govern the density of the additive manufactured parts.

Recently, cold sintering process (CSP) has been developed to densify many ceramic materials and related composites at extremely low temperatures through the application of a deviatoric stress that couples with a transient chemical phase enabling dissolution and precipitation mechanisms. More than 100 different ceramics and composites have been densified using this approach at relatively modest temperatures <300° C. and compacting pressures ~100 MPa. The process has also been extended to demonstrate the effect in metals that are used to make electrodes in multilayer ceramic passive components such as varistors and capacitors, and microwave filters. In addition, the low temperatures have enabled new types of nano-composites with modified grain boundaries and confined interfacial polymers and nanomaterials. Cold sintering in these applications has also enabled co-sintering of high-performance high conductivity inner electrodes of several metal chemistries with small particle sizes of 0.1 to 0.5 um that include Ag, Cu, Ni, Fe and Al. These metals under an applied stress can both cold sinter and densify under plastic deformation process to form the electrodes. The term cold sintering in metals was previously introduced by Gutmanas et al to the high-pressure compaction process of metals. In this case, there was no transient chemical phases that enables the dissolution or precipitation phase but high stresses ~4 GPa at room temperature enabled compaction and densification through plastic deformation. The ductile particulates materials such as Al, Cu, Co, Fe, and Fe—Ti alloys (316L, Inconel 600 and Ti6AlV) as well as refractory metals such as Nb, Mo, Ta and W were compacted using this process.

In this investigation, we report cold sintering process assisted warm compaction of iron powders that result in both improved densification and strengthening of iron compacts. The objective of this paper is to provide insight on densification and microstructural evolution at the interface due to cold sintering mechanism. The high strength compacts promote green machining and can potentially open new processing route for the manufacture of soft magnetic iron composites.

Iron powder (ATOMET 1001) for the study was provided by Advantage Powdered Metals Inc. A known amount of phosphoric acid ranging from 0.05 wt %-1 wt % relative to the mass of iron powders was dissolved in 500 mL of water. 250 g of iron powder was treated by mixing the powder in the aqueous phosphoric acid solution for 10 minutes. The resultant mixture was then filtered, washed thoroughly with ethanol and dried at room temperature. The as-treated powder was then mixed with 0.75 wt % of Acrawax binder in a turbula for 30 minutes prior to Cold sintering.

In order to prepare the transverse rupture strength (TRS) bars (according to MPIF Standard 41), the treated powders were first heated in a hot die placed in a Carver hot press until the temperature of the powder was the same as the die. TRS samples were then made at a compaction pressure of 620 MPa for 10 s. The cold sintering conditions were varied by changing the processing temperature from room temperature to 100° C. Two different controls (Conventional P/M and Warm compaction) were also produced by compacting the as-received iron powders under same compaction pressure and the die at room temperature and cold sintering conditions, respectively. Additionally, a 0.5" and 2" diameter hot dies were used to prepare samples that were ~0.25" thick to perform green machining operations. The green machining operations were demonstrated on cold sintered samples that had no binder. Fully sintered TRS bars were made using an industrial belt furnace maintained at 1150° C. under 90% Nitrogen+10% Hydrogen atmosphere at a belt speed of 0.15 m/min (~6 in/min). The samples were subject to high temperature sintering in the belt furnace for 30 min.

The densification behavior of both the iron powder (control) and the phosphoric acid treated iron powder was investigated using an apparatus that has (a) an ENERPAC® press in constant pressure mode, thanks to an electric hydraulic pump and (b) a dilatometer equipped with a Keyence GT2-H32 Digital Contact Sensor. In our study, both the control and the modified powders were first compacted at room temperatures at different pressures: 70, 100, 200 and 700 MPa for 10 s. For each given pressure, dilatometry data were collected in the anisothermal region, between room temperature and 180° C. using a 22.5° C./min average heating rate.

The axial displacement measured during CSP was corrected to account for the thermal expansion of the die, piston and punches. The calculated time-dependent thickness evolution (L(t)) was converted to relative density profiles using sample mass (m), area (A) and theoretical density ($\rho_{th}$) of iron powder as follows:

$$\rho_{rel}(t) = \frac{m}{AL(t)\rho_{th}} \quad (1)$$

The relative densities as a function of densification time at different pressures were then compared for both the control and cold sintered compacts.

The morphology of fractured cold sintered compacts and controls as well as microstructural characterization of high temperature sintered samples were studied using JEOL JSM-7200F FESEM microscope. The high temperature sintered samples were sectioned, mounted, polished and etched in 2% Nital solution to reveal the grain boundaries. Image analyses were performed using MIPAR and ImageJ software. Transmission Electron Microscopy for high resolution microstructural analysis was measured at 200 KV (TALOS F200X, FEI). The samples for the analysis were prepared using focused ion beam (FIB) system (Helios 660, FEI). Scanning transmission electron microscopy—energy dispersive X-ray spectroscopy (STEM-EDS) was measured using STEM with SuperX EDS system (TALOS F200X, FEI) for elemental mapping. Additionally, XRF analysis was performed using Epsilon XRF instrument to measure the phosphorus content of the treated powders. DRIFTS analysis was performed using FT-IR Bruker V70 instrument to study the chemical structure of phosphate coating on iron particles. DRIFTS cell was used to perform in situ experiments under argon atmosphere at various temperatures ranging from 22° C. to 200° C., respectively. Tranverse rupture strength was measured by mounting the sample on a 3-point bending fixture and applying load using an Instron universal testing machine.

Figure 25:
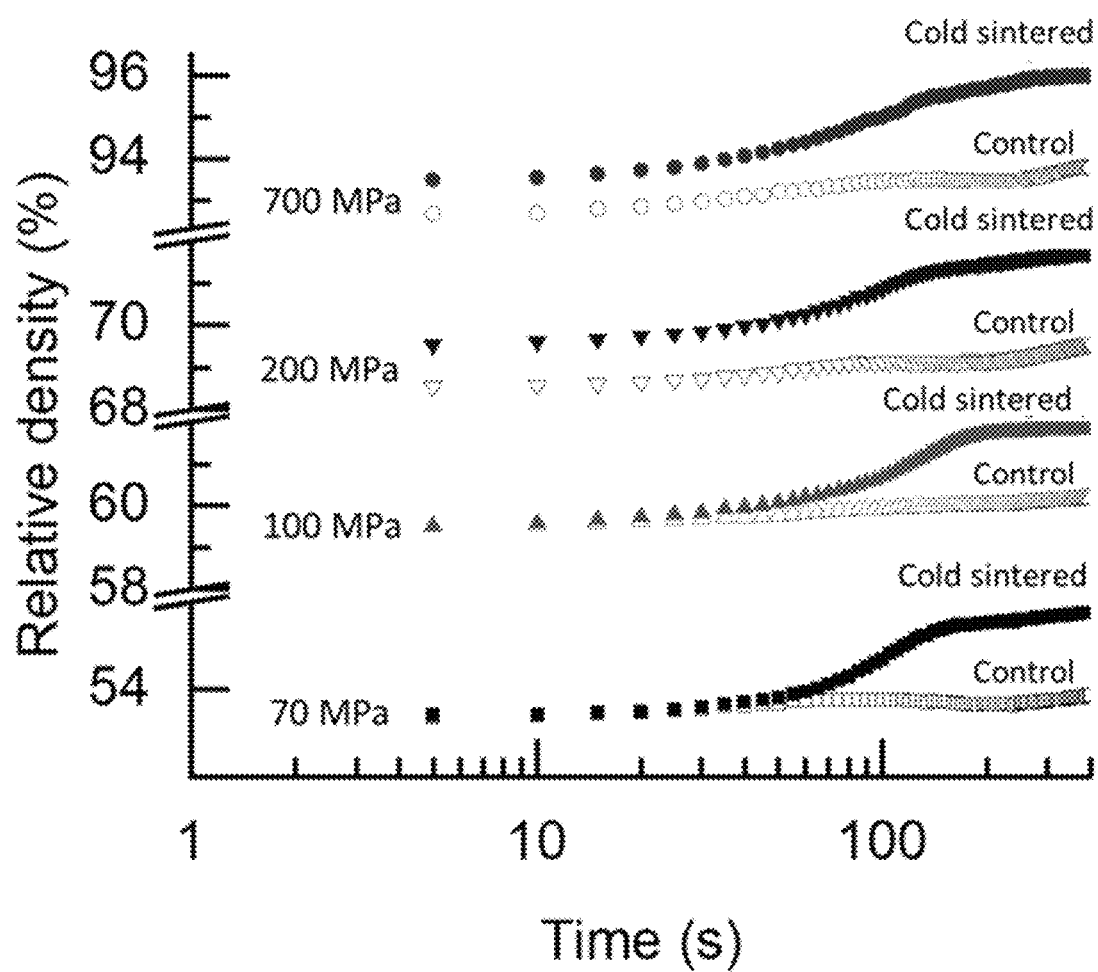
FIG. 25 shows the evolution of the relative density of plain iron (control) and phosphoric acid treated iron powders as a function of time when subjected to different pressures (70, 100, 200 and 700 MPa), at a constant heating rate in the anisothermal region.

FIG. 25 shows the relative density of iron (control) and cold sintered compacts obtained at different pressures in the anisothermal region between room temperature and 200° C. At room temperature (t=5 s), the relative densities achieved for the control at compaction pressures of 70 MPa, 100 MPa, 200 MPa and 700 MPa are 53.7%, 59.5%, 68.6% and 92.7%, respectively. The relative density for the control does not drastically change when the temperature of the compact was raised gradually from room temperature to 200° C. Curves of control samples at different pressures follow a similar pattern, as a small inflexion point is observed at approximatively t=250 s. The slight increase in relative density observed after the inflexion point may be associated with a drop in the yield strength of iron upon heating. The addition of phosphoric acid as a cold sintering aid consistently increases the relative densities of compacts at each pressure from t=60 s (above 90° C.), up to 1 to 2% in the anisothermal region. In cold sintered samples, a systematic increase in relative density is observed after t~30 s, likely due to chemical effects associated with the dissolution-precipitation creep mechanism. At t=0 s, the slight increase (<1%) in relative density observed between the control and the cold sintered samples for the 200-700 MPa pressure ranges may be due to enhanced particles rearrangement in the presence of a liquid phase.

Figure 26:
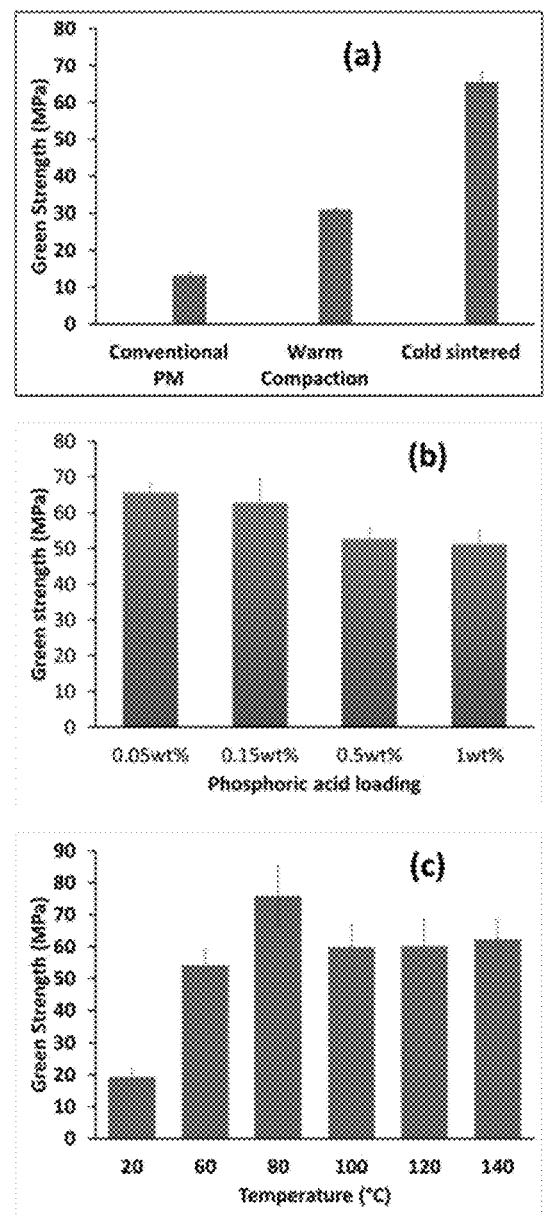
FIG. 26 shows (a) a comparison of green strength of iron compacts made using conventional PM, Warm Compaction and Cold sintering process, (b) Green strength as a function of phosphoric acid treated powders made using different phosphoric acid loading and compacted at 620 MPa and 100° C. and (c) Green strength as a function of compaction temperature of 0.15 wt % phosphoric acid treated iron compacted at 620 MPa.

The impact of addition of cold sintering aid on the green strength of the compacts are illustrated in FIG. 26. Iron powders compacted at 620 MPa at room temperature had a typical green strength of 13 MPa, which is consistent with pressed powders using conventional P/M processes and acrawax binder. All the pressed samples had green density of ~7.1-7.2 g cm$^{-3}$ (91% relative density). When the powders were warm compacted at 100° C., the green strength increased to about 30 MPa due to better interlocking between the particles. These values are comparable to high green strength of iron compacts achieved using specialty polymeric binders reported in the literature. The powders when treated with phosphoric acid and subjected to cold sintering conditions significantly improves the green strength to almost 65 MPa, which is more than two times that of the warm compacted control (FIG. 26(a)). Systematic variation of phosphoric acid loading during surface modification showed that phosphoric acid loading as low as 0.05 wt % is enough to improve the green strength. Further increase in the phosphoric acid loading results in slight decrease in green strength as shown in FIG. 26(b) 2b. XRF analysis of the treated iron powders shows that the P content increased from 0.27 at % to ~0.85 at % for 0.05 wt % and 1 wt % phosphoric acid loading, respectively. FIG. 26(c) shows the change in green strength of 0.15 wt % phosphoric acid loading with increased temperature. The treated powder when compacted at room temperature did not show any significant improvement relative to conventional P/M compacts. However, when the temperature was increased beyond 60° C., there was considerable increase in the green strength, which remained relatively unchanged beyond 100° C. The Hall flow rate of treated powders was ~42 s which was similar to as-received iron powder (39 s) suggesting that the flow properties of the powders due to cold sintering chemistries were not significantly altered. This is very helpful in meeting the powder flow requirements in a manufacturing environment. Additionally, the fact that the green strength improved at a modest temperature of 60° C. suggests that it could also be extended to warm die compaction instead of warm compaction process.

Figure 27:
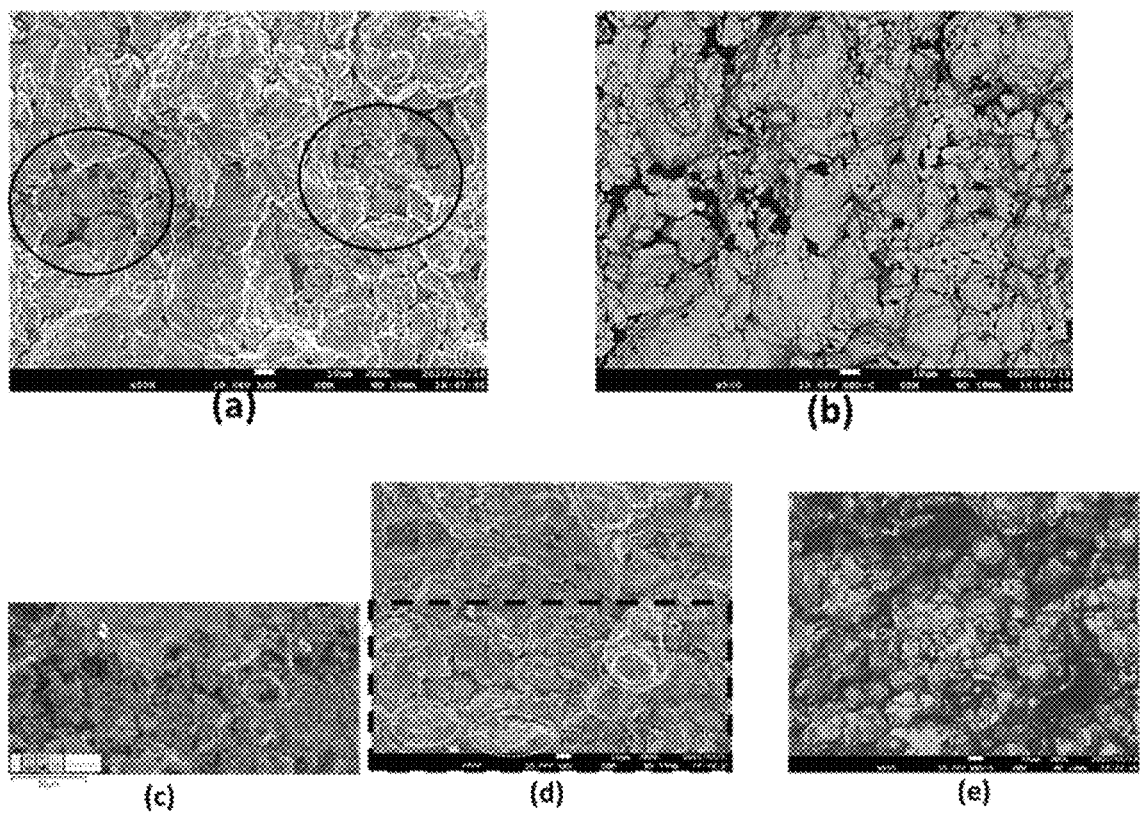
FIG. 27 shows (a) a cross sectional secondary electron image of a fractured TRS bar made using warm compacted iron (control), (b) a back scattered image of the fractured warm compacted iron sample, (c) an EDS mapping of selected area of cold sintered iron compact, (d) a secondary electron image of fractured cold sintered iron compact and (e) a back scattered image of the fractured cold sintered compact.

FIGS. 27(a) and (b) shows the secondary electron and back scattered electron image of the fractured warm compacted control. The Secondary electron image shows evidence of particles dislodging during the TRS measurement. The dark region in the backscattered image reveals the presence of binders at the particle interface. Intergranular fracture is the most dominant mode of failure in the control. FIGS. 27(c) and (d) shows the corresponding secondary electron and back scattered images of Cold sintered sample. The secondary electron image shows much more denser compacts with several regions that indicate shearing of particles. The contrast under backscattered mode along with EDS mapping further accentuates these regions as seen from the white regions which represent sheared iron particles surrounded by phosphate coated iron. These features indicate that there is transgranular fracture in Cold sintered sample and shows further evidence of strong cohesion between iron particles due to cold sintering.

Figure 28:
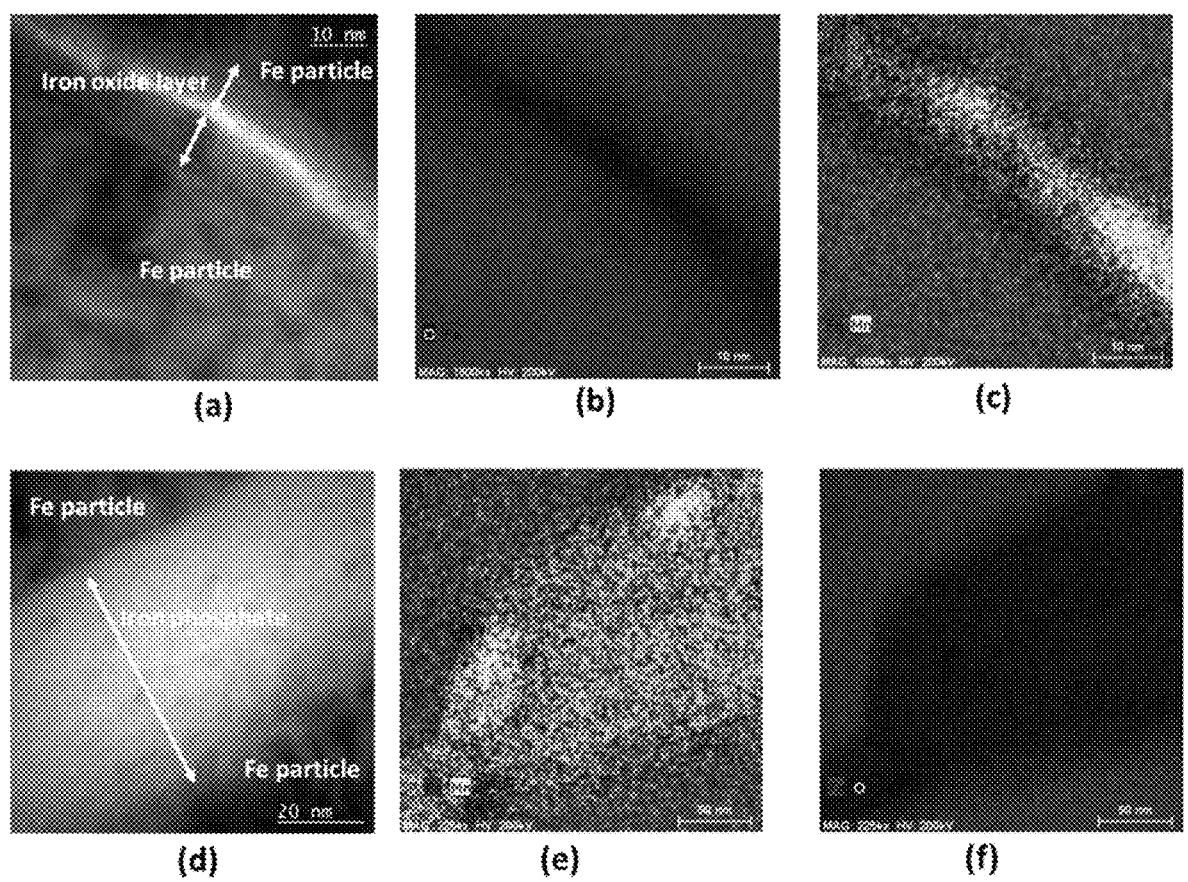
FIG. 28 shows (a) a STEM micrograph of warm compacted iron (control), (b) and (c) EDS mappings of warm compacted iron, (d) a STEM micrograph of cold sintered iron compact showing an iron phosphate interphase bridging two iron particles, (e) and (f) EDS mappings of cold sintered specimen interface.

TEM studies were done on carefully selected FIB cross sections of iron compacts that accounted for interfacial region between two iron particles. FIG. 28(a)-(c) shows both the STEM and EDS mapped regions that capture the interface between two iron particles in warm compacted control. The STEM shows the presence of a 10 nm thick iron oxide layer on the surface of both the particles. The presence of a small gap between the two particles is a clear indicator that physical interlocking is the primary contributor to the cohesive strength between the particles. EDS mapping shows the presence of Fe, O and Mn near the particle interface. The base metal powder for iron is ATOMET 1001 which has 0.15% Mn. FIG. 28(d)-(f) shows the TEM study on phosphate coated iron powder. We can see presence of a continuous phosphate coating at the interfacial region between two iron particles. Unlike the control, this coating completely bridges the gap between the two Fe particles. Closer inspection of the interphase suggests that the coating is predominantly amorphous iron phosphate. However, there are also 1-2 nm dark nanocrystalline iron phosphate dispersed throughout the amorphous matrix. The iron phosphate interphase is ubiquitous across all particle interfaces, and we believe that this contributes primarily to the high cohesive strength of cold sintered iron compacts.

Figure 29:
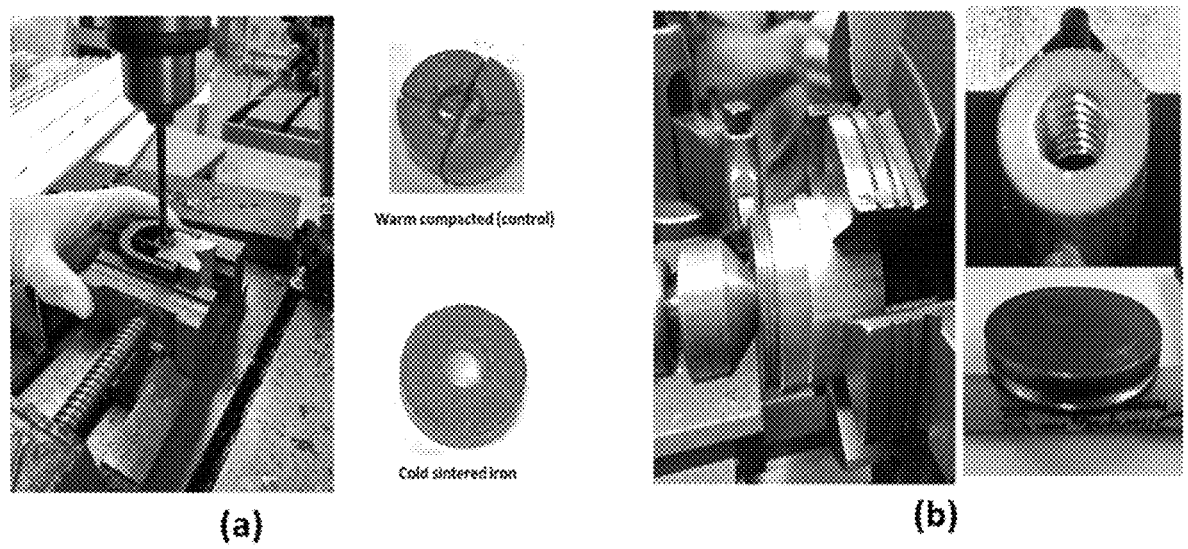
FIG. 29 shows (a) a 0.5" diameter cold sintered sample drilled using 0.25" drill bit mounted on a milling machine and machinability of cold sintered sample relative to warm compacted iron (control), (b) a 2" diameter cold sintered sample mounted on a lathe and turning operation performed to create a groove in the compact and a 0.5" diameter cold sintered sample being tapped and threaded.

FIG. 29 demonstrates the possibility of performing green machining on cold sintered iron compacts. The cold sintered compact in addition to providing sufficient mechanical stability to perform operations (facing, turning and drilling) using milling machine and lathe can also be used for tapping. To our knowledge, this has not been demonstrated earlier and the results are quite extraordinary considering that the powdered sample has only been subjected to modest compaction temperatures and is devoid of any binder material.

Figure 30:
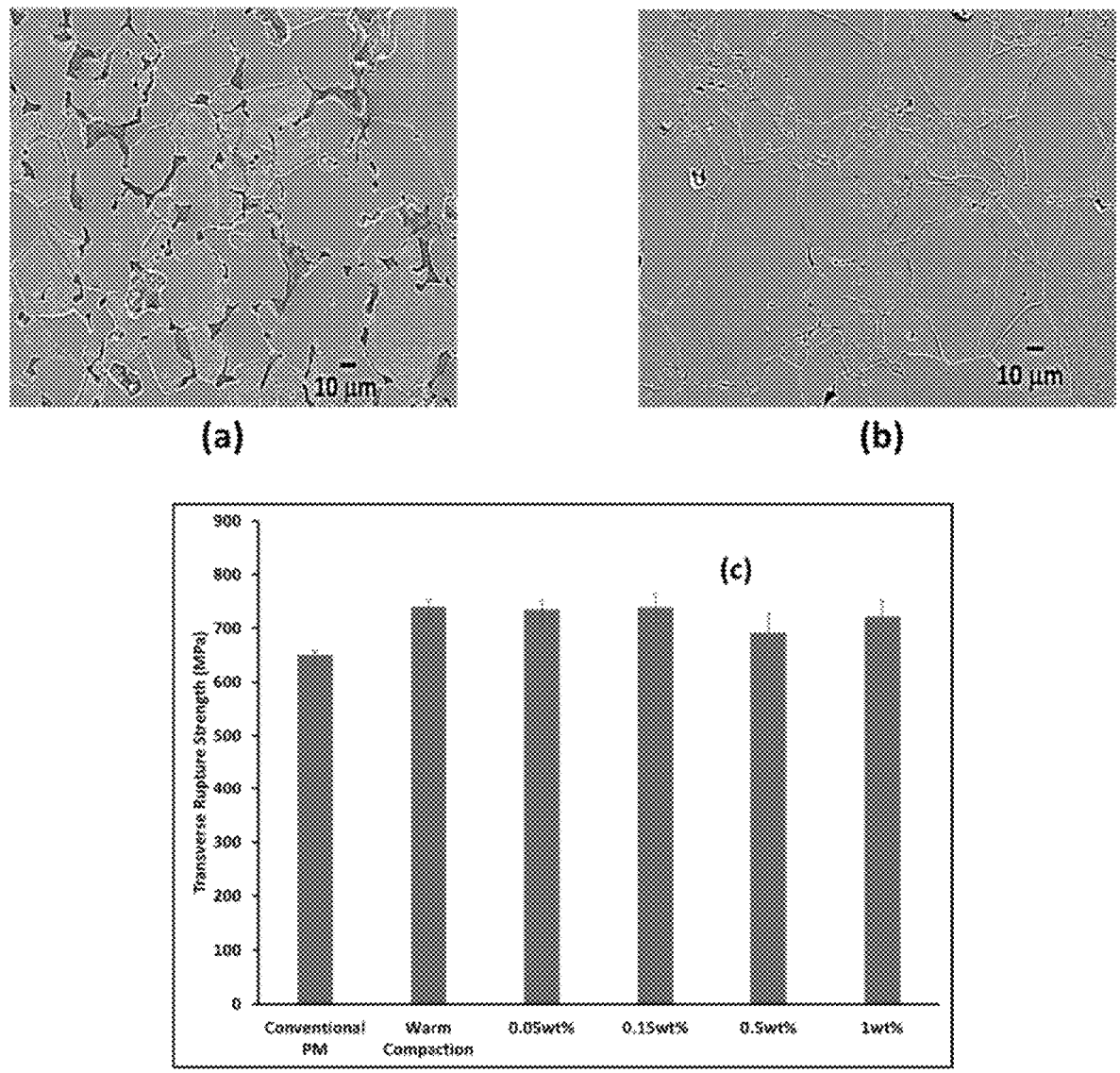
FIG. 30 shows (a) a scanning electron micrograph of etched warm compacted iron heat treated at 1150° C. under 90% Nitrogen 10% Hydrogen atmosphere, (b) a scanning electron micrograph of etched cold sintered sample heat treated at 1150° C. under 90% Nitrogen 10% Hydrogen atmosphere and (c) a comparison of transverse rupture strength of high temperature sintered iron compacts made using room temperature conventional P/M process, warm compacted iron and cold sintered samples made using varying amount of phosphoric acid.
Figure 31:
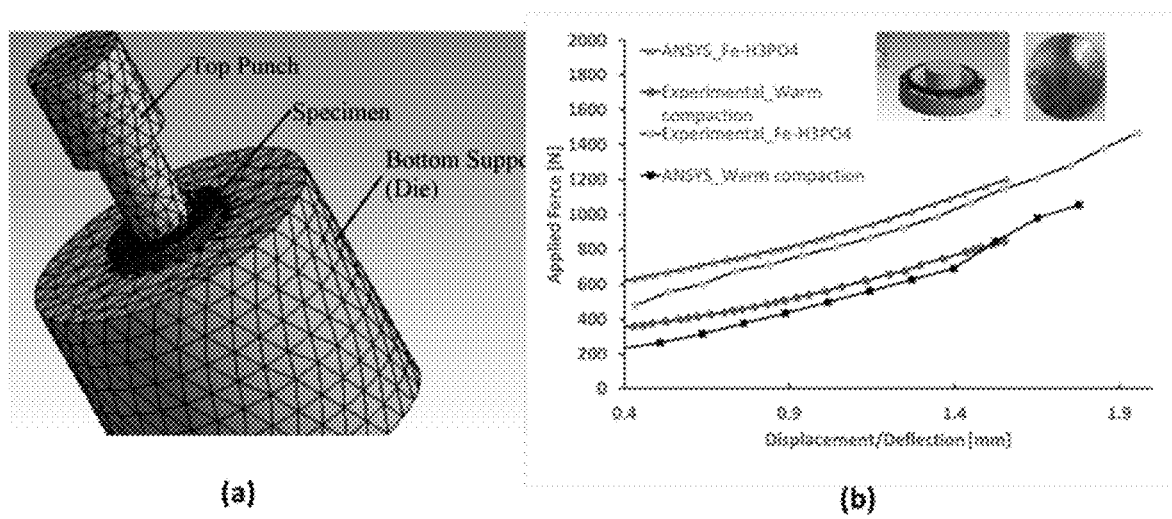
FIG. 31 shows (a) meshing of top punch, sample and bottom support using ANSYS for modeling the performance of circular bending test and (b) force-deflection curve of high temperature sintered warm compacted iron (control) and cold sintered sample fitted using ANSYS.
Figure 32:
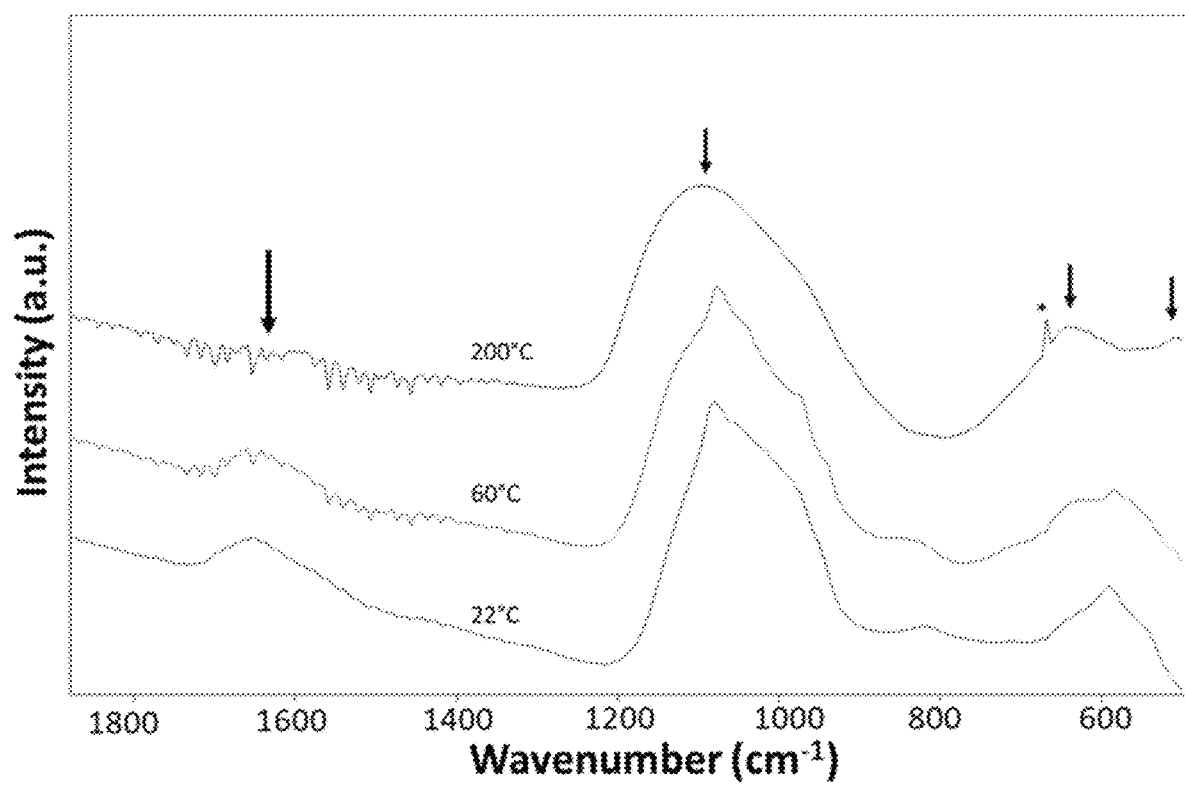
FIG. 32 shows DRIFTS spectra of phosphoric acid treated iron powder as a function of temperature, wherein * indicates an artifact peak due to presence of CO2 gas in air.

The iron compacts were further subjected to conventional high temperature sintering conditions in an industrial belt furnace. FIGS. 30(a) and (b) show the etched microstructure of warm compacted control and Cold sintered sample subjected to 1150° C. The porosity between the grain boundaries in the warm compacted control can be clearly seen and are irregular in shape. On the other hand, cold sintered sample has relatively smaller well-rounded occluded porosity and larger grain growth that are characteristic of phosphorus containing sintered iron. Previous studies on high temperature sintering of phosphate coated iron have shown that when the sintering temperature exceeds 1110° C., there is a change in the microstructure due to liquid phase sintering that is created due to interactions in the $Fe_2O_3$—$P_2O_5$ system, leading to coarsening and joining of isolated iron particles to a continuous α-Fe phase surrounded by areas of solidified liquid phase, which is ferric phosphate compounds such as $FePO_4$, $Fe_3PO_7$, $Fe_4(P_2O_7)_3$ and $Fe(PO_3)_3$. FIG. 30(c) shows the comparison of transverse rupture strength of control (conventional P/M at room temperature compaction and warm compaction) against the cold sintered sample. The transverse rupture strength of both warm compacted control and cold sintered samples were higher relative to conventional P/M at room temperature compaction. The treated powders with various phosphoric acid loading up to 1 wt % showed relatively similar transverse rupture strength as shown in FIG. 31(b). However, the sintered density slightly decreased from 7.13 g cm-3 to 7.03 g cm-3 at 0.05 wt % and 1 wt % phosphoric acid loading, respectively. Furthermore, bending tests were performed on high temperature sintered warm compacted control and cold sintered circular (Ø12.5× 1.5 mm thick) specimens using an Instron universal testing machine. The convergence and flexural behavior of these specimens was also simulated using ANSYS finite element (FE) software and validated by comparing the results with experimental values as shown in FIG. 32. The FE modeling was performed using Augmented Lagrange formulation with frictional contacts between mating surface and large deflection analysis. Material and geometrical nonlinearities were considered in the analysis, and both force and displacement tolerance convergence values were set to 0.001. In order to fit the load-deflection curves for both the samples, the material properties of sintered iron-based P/M parts were used in the ANSYS model for the control sample and modified for the reduced porosity in the cold sintered specimen. It is clear from FIG. 31 that the numerical and experimental results were comparable and showed that there was appreciable improvement in both elastic modulus and yield strength of cold sintered sample after high temperature treatment. The elastic modulus and Yield strength increased from 100 GPa to 160 GPa and 100 MPa to 150 MPa, respectively while the tangential modulus decreased from 1.45 GPa to 1.2 GPa.

In order to gain insight on the structural change during cold sintering process, in situ DRIFTS experiment was conducted on the treated powders. The DRIFTS spectra were collected as a function of temperature with the temperature ranging from 22° C. to 200° C. as shown in FIG. 32. The spectrum collected at room temperature showed distinct peaks characteristic of hydrated phosphates with a broad peak at 3200-3500 cm$^{-1}$ corresponding to —OH stretch and a peak at 1640 cm$^{-1}$ related to H2O bending mode. The intensity of both peaks decreased with increase in temperature indicative of elimination of water under cold sintering conditions. The presence of P—O and P—O—P linkage were seen from the presence of multiple peaks in the range of 900-1200 cm$^{-1}$ and 500-800 cm$^{-1}$, respectively. Phosphates can be formed as isolated tetrahedron ($PO_4^{3-}$) denoted as $Q^0$, two phosphate tetrahedra connected by a bridging oxygen ($P_2O_7^{4-}$) denoted as $Q^1$ or a higher ordered chain connecting phosphate tetrahedra with two bridging oxygens ($P_3O_{10}^{5-}$) denoted as $Q^2$, respectively. At room temperature and 60° C., we see a sharp peak at 1080 cm$^{-1}$ which gets upshifted and becomes broader at 200° C. The peak at 1080 cm$^{-1}$ is attributed to the presence of $Q^1$ units and an upshift may be indicative of forming higher order $Q^2$ units. Additionally, the gradual disappearance of shoulder peak at 980 cm$^{-1}$ with the emergence of a peak around 630 cm$^{-1}$ and 500 cm$^{-1}$ is also indicative of the formation of $Q^2$ units at the expense of $Q^0$ and $Q^1$ units at 200° C. We anticipate that these changes could be further accelerated by the application of pressure under cold sintering conditions. Our results indicate that under cold sintering conditions, two things occur. Firstly, there is increased mobility and transport of water phase at the interface which acts as the transient liquid phase promoting rearrangement, dissolution and precipitation at the particle boundary. Secondly, the structure of orthophosphates and pyrophosphates may be converted into higher order polyphosphates and the resultant stronger covalent P—O—P linkages increases the cohesive strength at the particle interfaces. Table 3 summarizes various infrared bands and their assigned peaks.

TABLE 3

Infrared peak positions and their corresponding band assignments of hydrated phosphate functional groups.

| Peak Position | Band Assignment |
| --- | --- |
| 3200-3500 cm$^{-1}$ | —OH stretch |
| 1640 cm$^{-1}$ | H$_2$O bending mode |
| 1100-1130 cm$^{-1}$ | Asymmetric bending vibrations P—O bonds in $Q^2$ units |
| 1080 cm$^{-1}$ | Asymmetric bending vibrations P—O bonds ($Q^1$ units) |
| 980-990 cm$^{-1}$ | Asymmetric bending vibrations P—O bonds ($Q^0$ units) |
| 830 cm$^{-1}$ | Asymmetric bending vibrations P—O—P bonds ($Q^0$ units) |
| 630 cm$^{-1}$ | Asymmetric bending vibrations P—O—P bonds ($Q^2$ units) |
| 500 cm$^{-1}$ | Asymmetric bending vibrations P—O bonds ($Q^2$ units) |

Figure 33:
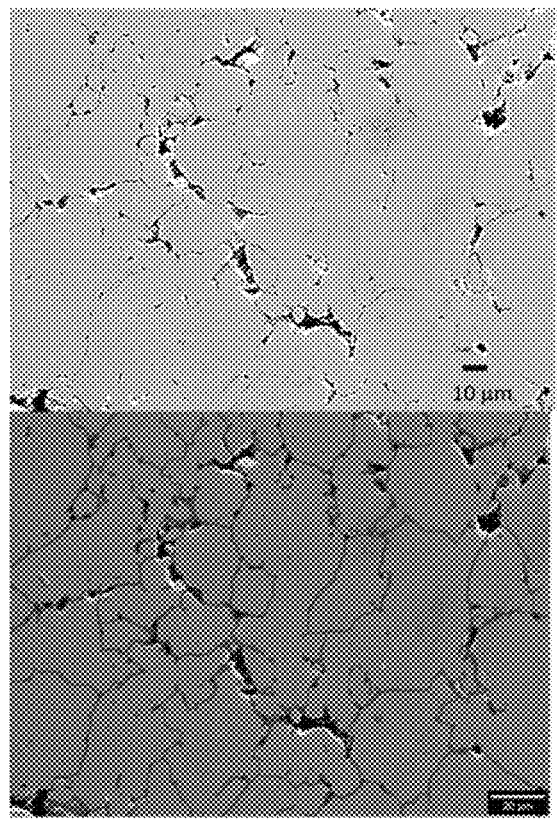
FIG. 33 shows a comparison of microstructure of warm compacted control and cold sintered sample compacted at 620 MPa and 100° C. and an image analysis showing the particle boundary and highlighting the presence of porosity and triple junction in the compacted samples.
Figure 33:
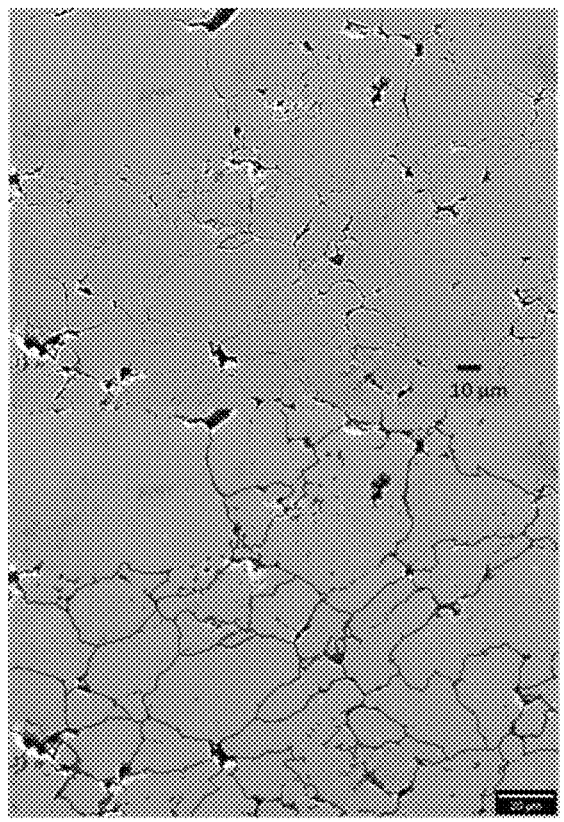

It is also remarkable to see distinct microstructural change under cold sintering conditions as shown in FIG. 33. We notice that the warm compacted control has many interconnected pores while the pores in the cold sintered compacts are relatively less and far more isolated. Additionally, we also see the presence of several triple junction points that clearly show solid-solid interfaces. Liu et al. had developed a strength model that describes the major driving force for densification during liquid phase sintering in terms of capillary force and solid bonding effect. They state that during the initial stages, capillary forces aid in the rearrangement and densification via viscous flow. But as the compacts form a percolated structure, the rigidity of the compact is primarily influenced by solid bonding between the particles. Contiguity, which is a quantitative measure of the interphase contact (ratio of contact area to grain surface area) takes into account both these factors. The model describes the driving force capillary force pressure as:

$$P_n = \frac{5.2\gamma_{LV}\cos\theta}{D(\Delta L/L_0)} \qquad (2)$$

where the value of $\Delta L/L_0$ is obtained from the dilatometry experiment, average particle size, D of ~100 μm was used based on laser diffraction data, $\gamma_{LV}$ for water is 5.89×10-2 MPa at 100° C. and we assume incipient wetting at the interface.

Under cold sintering conditions, since we apply both pressure and temperature, we also include stress due to plastic deformation in the compact strength equation as follows:

$$\sigma = \frac{3V_s}{2}(P_n + \sigma_0 C_{ss}) + \sigma_w \qquad (3)$$

where $V_s$ is the solid volume fraction, $\sigma_0$ is yield strength of iron, $C_{ss}$ is the contiguity factor and $\sigma_w$ is the stress due to plastic deformation during compaction. $\sigma_w$ was computed based on the compact strength of room temperature P/M compacts, which is devoid of capillary driving force and solid-solid bonding.

Figure 34:
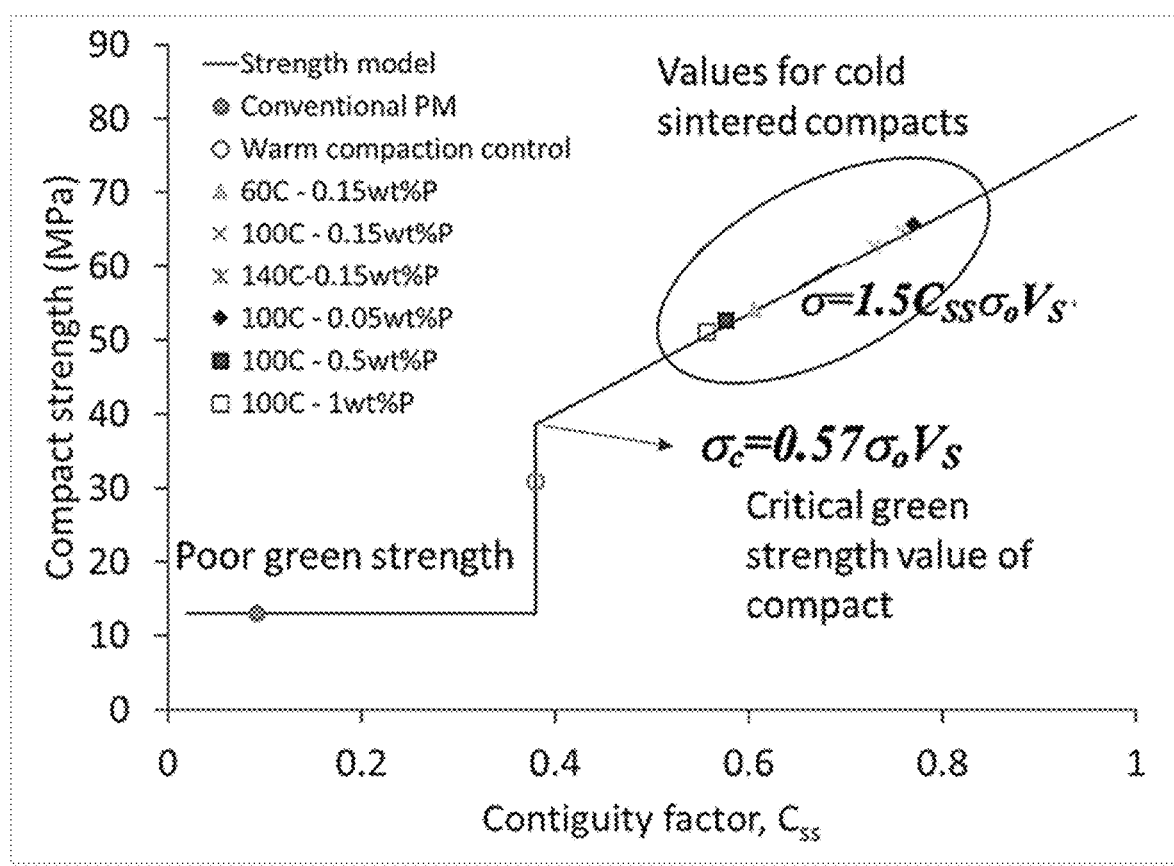
FIG. 34 shows a strength model showing the increase in contiguity factor for cold sintered specimen relative to warm compaction and conventional PM control samples.

FIG. 34 shows the relationship between compact strength and contiguity factor, $C_{ss}$ as predicted by the model. The compact green strength as determined by TRS measurements are represented in the plot and based on the model, contiguity factor is determined. The model defines a critical contiguity for no distortion based on percolation theory as 0.38 as:

$$\sigma = \begin{cases} \frac{3}{2} V_s \sigma_0 C_{ss} + \sigma_w & \text{for } C_{ss} > 0.38 \\ \sigma_w & \text{for } C_{ss} < 0.38 \end{cases} \quad (4)$$

As shown in the plot, the contiguity factor for both the controls (room temperature compaction and warm compaction) are below the contiguity factor as the primary contribution to both these samples were plastic deformation aided mechanical interlocking of particles. All the cold sintered samples prepared under varying conditions showed contiguity factor ranging from 0.55 to 0.76, which is significantly greater than the critical contiguity factor. These higher numbers indicate that the contribution from solid-solid bonding is greater, and the chemical bonding as evidenced from DRIFTS experiment during cold sintering plays an important role. German et al. have also described a model that shows the contiguity variation with dihedral angle and solid volume fraction as:

$$C_{ss} = V_s^2 (0.43 \sin \phi + 0.35 \sin^2 \phi) \quad (5)$$

Figure 35:
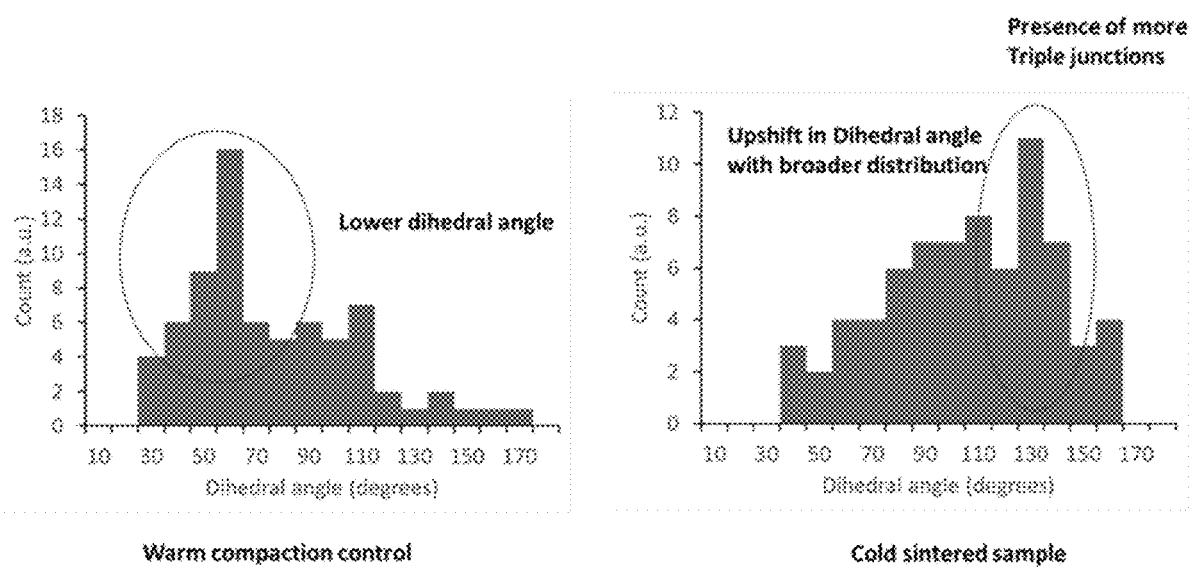
FIG. 35 shows a 2D dihedral angle measurements based on the microstructure of warm compaction control and cold sintered sample.

The equation was developed to describe spherical particles and as such cannot be directly applied to the irregular shaped iron particles in this work. However, it is clear from the equation that for a similar solid volume fraction, increase in contiguity factor will result in corresponding increase in the dihedral angle. This trend was validated by the good agreement of apparent 2D dihedral angles measured based on the microstructure of warm compacted control and cold sintered samples as shown in FIG. 35. The dihedral angle distribution of warm compacted control range between 30°-60° with very few triple junctions as denoted by a dihedral angle of 120°. On the other hand, cold sintered samples show an upshift with dihedral angles ranging from 50°-90° along with the presence of significant number of triple junctions.

Figure 36:
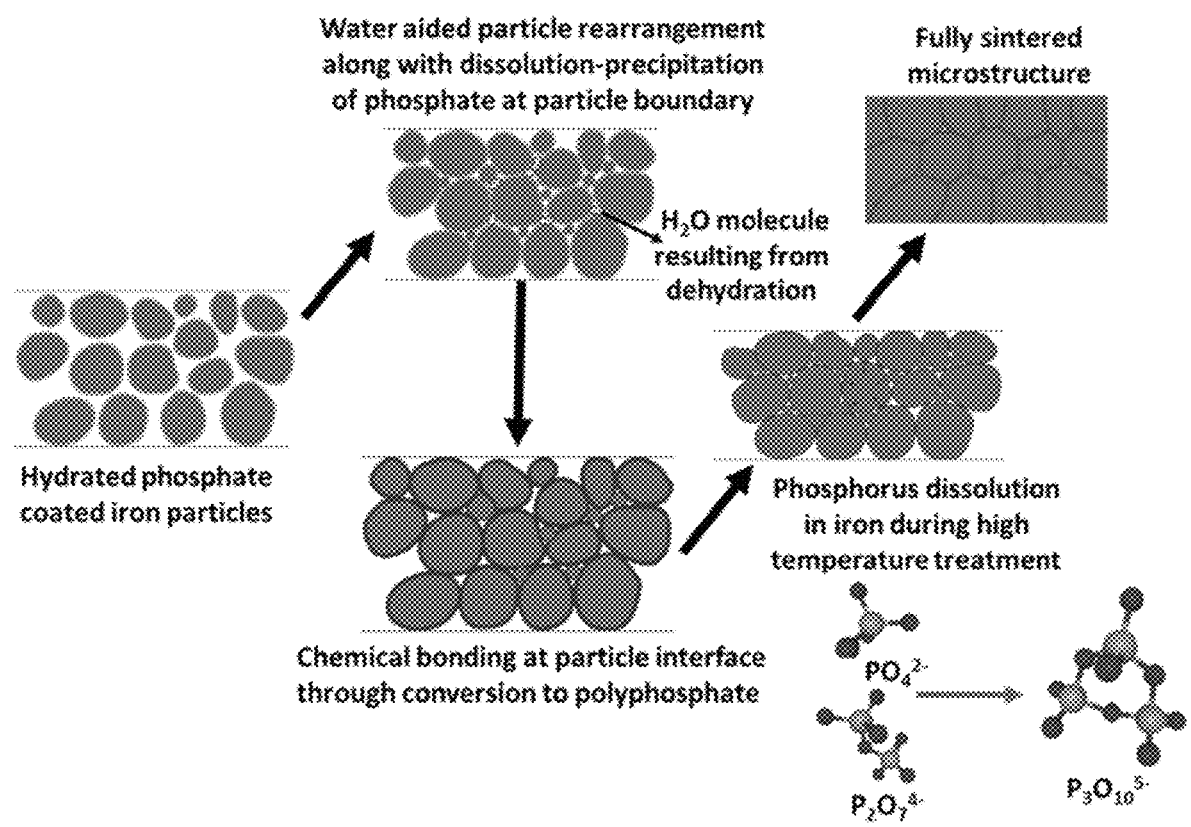
FIG. 36 is a schematic illustrating the impact of cold sintering process on densification and strengthening of powdered iron compact.

The paper thus describes the development of a low temperature transient liquid sintering process called cold sintering that helps to significantly increase the green strength of powdered metal compacts. Elimination of water from a thin layer of hydrated phosphate layer around iron particles forms the liquid phase and provides the impetus to initiate rearrangement and densification of compact during cold sintering. Simultaneously, we also see evidence for strong solid-solid bonding at interface due to the structural transformation of phosphate to form chain or polyphosphates with covalent P—O—P linkages that forms a co-continuous phase at the particle interfaces as shown in FIG. 36. The use of pretreated iron powders limits the phosphorus content on iron to less than 1 at % and as such when subjected to high temperature treatment, it does not result in deterioration of the mechanical properties as demonstrated by both the TRS and circular bending measurements.

With the Cold Sintered Assisted Warm Compaction there are potential opportunities to extend the process across many alloy systems with the basic process and strategies identified from this model iron demonstration. In addition, working at these low temperatures and enhanced strengths along with the machining opportunities can help in increasing manufacturing production rates, as compositions that are more readily machined can be shaped and later re-sintered to design with appropriate hardness with a time-temperature-transformation strategy. In addition, new types of composites could be noted with this processing strategy with different alloyed metal powders, cermets, and beyond to design functional properties in P/M. It also opens pathways to design insulating boundaries at iron particle interface and fabricate soft magnetic composites, which is a critical application targeted by P/M industries to aid the electrification of automotive market. The introduction of this paper, is hoped to ignite new opportunities in the field of P/M Cold sintering is a low temperature densification process that has been demonstrated widely in various ceramic materials. We adopt this process to improve the densification and strengthening of powdered metal iron compacts. This has been achieved by first modifying the surface of iron using a hydrated phosphate layer prior to the warm compaction. During warm compaction, $H_2O$ molecules resulting from the phosphate coating dehydration acts as a transient liquid phase promoting densification through rearrangement and dissolution-precipitation processes at particle interfaces. The interfacial solid-solid bonding is further strengthened by the chemical transformation of phosphates and pyrophosphates to polyphosphates. The impact of cold sintering on densification was demonstrated using dilatometry studies while the improved green strength measured using transverse rupture strength analysis showed that the process can facilitate green machining. A strength model based on microstructural analysis suggests that cold sintering results in stronger bonding at the interface. Proper choice of cold sintering chemistries and the associated chemo-mechanical processes at the particle contact can potentially provide a generic solution to improving green strength and green density of powdered metal compacts used in P/M industries. Furthermore, with these improvements it opens new opportunities to manufacturing strategies for higher performance components.

It should be understood that modifications to the embodiments disclosed herein can be made to meet a particular set of design criteria. For instance, the number of or configuration of components or parameters may be used to meet a particular objective.

It will be apparent to those skilled in the art that numerous modifications and variations of the described examples and embodiments are possible in light of the above teachings of the disclosure. The disclosed examples and embodiments are presented for purposes of illustration only. Other alternative embodiments may include some or all of the features of the various embodiments disclosed herein. For instance, it is contemplated that a particular feature described, either individually or as part of an embodiment, can be combined with other individually described features, or parts of other embodiments. The elements and acts of the various embodiments described herein can therefore be combined to provide further embodiments.

It is the intent to cover all such modifications and alternative embodiments as may come within the true scope of this invention, which is to be given the full breadth thereof. Additionally, the disclosure of a range of values is a disclosure of every numerical value within that range, including the end points. Thus, while certain exemplary embodiments of systems, device, and methods of making and using the same have been discussed and illustrated herein, it is to be distinctly understood that the invention is not limited thereto but may be otherwise variously embodied and practiced within the scope of the following claims.

What is claimed is:

1. A method of forming a metal mixture to be densified, the method comprising:
   combining a solvent with metal powders to form a mixture; and
   modifying the surface of the metal powders by applying a treatment to form a dihydrate coating or a metal coating prior to cold-sinter densification of the treated metal powders;
   densifying the treated metal powders via application of pressure and temperature of a cold-sinter densification process.

2. The method of claim 1, further comprising:
   adding a sintering aid to form a eutectic at a predetermined low temperature for stabilizing crystal structure shapes.

3. The method of claim 2, wherein:
   the sintering aid comprises phosphorous, boron, and/or manganese.

4. The method of claim 1, wherein:
   the metal powders are any one or combination of iron, nickel, steel, stainless steel, copper, brass, bronze, copper-silver alloy, tantalum, titanium, and silver.

5. The method of claim 1, wherein:
   the solvent includes any one or combination of $CuSO_4$/Sodium citrate aqueous solution and acetic acid with water.

6. A method of forming a densified material from a metal mixture, the method comprising:
   combining a solvent with metal powders to form a mixture;
   modifying the surface of the metal powders by applying a treatment to form a dihydrate coating or a metal coating prior to cold-sinter densification of the treated metal powders;
   densifying the treated metal powders via application of pressure and temperature of a cold-sintering densification process, wherein:
     the pressure evaporates the solvent via a transient aqueous environment;
     the temperature causes the solvent to further evaporate, supersaturate any solubilized species, and densify the metal compound; and
     melting temperatures of fluxes formed in the mixture are suppressed during the application of pressure and temperature due to the modified surface of the metal powders, leading to densification of the metal compound by a mediated dissolution-precipitation process; and
   generating a densified material that is >90% the theoretical density for the metal compound.

7. The method of claim 6, wherein the densified material is generated without use of a binder.

8. The method of claim 6, further comprising:
   allowing the solvent to partially solubilize the metal powders to form the mixture.

9. The method of claim 6, further comprising:
   allowing a high-temperature melt of metal material formed during the application of pressure and temperature to dissolve precursor material and promote nucleation, leading to growth of a crystal from the aqueous solution.

10. The method of claim 6, further comprising:
    generating a hydro-flux that spans a regime between flux growth and hydrothermal growth so that an intersection of hydrothermal and flux-based crystal growth in a phase diagram introduces a mass transport phase at temperatures at or near a boiling point of the solvent, the mass transport phase being a non-aqueous solution.

11. The method of claim 6, wherein:
    applying pressure comprises applying 520 MPa;
    applying temperature comprises applying temperature within a range from 25° C. to 300° C.

12. The method of claim 6, further comprising:
    adding a sintering aid to form a eutectic at a predetermined low temperature for stabilizing crystal structure shapes.

13. The method of claim 6, wherein the generated densified material is machinable.

14. The method of claim 13, further comprising forming the densified material into a cold sintered pellet, and one or more of the following:
    drilling a hole through the cold sintered metal pellet;
    taping or threading the cold sintered metal pellet; and
    performing a turning operation on the cold sintered pellet on a lathe.

15. The method of claim 6, further comprising:
    depositing a metal or a compound at metal interfaces of the metal powders to promote bonding between particles;
    sinter bonding at low temperatures with metal components to add functionality;
    cold sintering the metal powders to improve strength, hardness, and/or toughness;
    cold sintering the metal powders with the addition of polymeric materials;
    infiltrating with low temperature eutectic alloys; and/or
    vacuum impregnating with sealant.

* * * * *